United States Patent [19]
Sekiguchi

[11] Patent Number: 5,596,432
[45] Date of Patent: Jan. 21, 1997

[54] LIQUID CRYSTAL DISPLAY HAVING ILLUMINATED NONLINEAR RESISTANCE ELEMENTS

[75] Inventor: Kanetaka Sekiguchi, Sayama, Japan

[73] Assignee: Citizen Watch Co., Ltd., Tokyo, Japan

[21] Appl. No.: 609,054

[22] Filed: Feb. 29, 1996

Related U.S. Application Data

[63] Continuation of Ser. No. 84,793, Jun. 29, 1993, abandoned.

[30] Foreign Application Priority Data

| Jul. 3, 1992 | [JP] | Japan | 4-198934 |
| Nov. 27, 1992 | [JP] | Japan | 4-341341 |
| Dec. 8, 1992 | [JP] | Japan | 4-351421 |

[51] Int. Cl.$^6$ .................. G02F 1/136; G02F 1/1335; G02F 1/1333
[52] U.S. Cl. .................. 349/51; 349/95; 349/110; 349/113
[58] Field of Search .................. 359/58, 40, 67, 359/70

[56] References Cited

U.S. PATENT DOCUMENTS

| 4,676,603 | 6/1987 | Fevtig | 359/62 |
| 4,861,141 | 8/1989 | Nakazawa | 359/58 |
| 5,164,850 | 11/1992 | Tanaka et al. | 359/58 |
| 5,253,092 | 10/1993 | Takahashi | 359/58 |
| 5,349,453 | 9/1994 | Munakata | 359/40 |

FOREIGN PATENT DOCUMENTS

| 0185995 | 7/1986 | European Pat. Off. . | |
| 2537316 | 9/1983 | France . | |
| 3446536 | 7/1986 | Germany | 359/58 |
| 62-267723 | 11/1987 | Japan | 359/40 |
| 5-100222 | 4/1993 | Japan | 359/70 |

OTHER PUBLICATIONS

Patent Abstracts of Japan, vol. 011077, JP 61–232689, Mar. 7, 1987.
Patent Abstracts of Japan, vol. 014530, JP 2–226120, Nov. 21, 1990.
Patent Abstracts of Japan, vol. 016175, JP 4–018523, Apr. 27, 1992.

*Primary Examiner*—William L. Sikes
*Assistant Examiner*—Ron Trice
*Attorney, Agent, or Firm*—Loeb & Loeb LLP

[57] ABSTRACT

A liquid crystal display having nonlinear resistance elements. Liquid crystal is held between a first substrate and a second substrate. A first electrode and a second electrode are formed on the first substrate, and a nonlinear resistance element is formed in an area in which the first and second electrodes are opposite to each other via an insulating film. Light emission means for emitting light to the nonlinear resistance element is also contained. Light is emitted to the nonlinear resistance element area by the light emission means to improve asymmetry of the nonlinear current-voltage characteristic of the nonlinear resistance element for providing improved display quaility of the liquid crystal display.

18 Claims, 20 Drawing Sheets

LIQUID CRYSTAL DISPLAY HAVING ILLUMINATED NONLINEAR RESISTANCE ELEMENTS

This is a continuation of application Ser. No. 08/084,793 filed on Jun. 29, 1993, now abandoned.

BACKGROUND OF THE INVENTION

1. Field of the Invention

This invention relates to an improvement in the characteristics of nonlinear resistance elements of a metal-insulating film-metal (MIM) structure formed on substrates of a liquid crystal display.

2. Description of the Related Art

In recent years, the number of picture elements of a display using a liquid crystal display panel has been increasing more and more. In a system which uses multiplex driving for a display of a passive matrix structure, as the time division grade becomes high, the contrast or the response speed degrades and if about 200 scanning lines are contained, it becomes difficult to provide a sufficient contrast.

To eliminate such disadvantages, a liquid crystal display panel of an active matrix system which provides a switching element for each picture element is adopted.

The active matrix liquid crystal display panels are roughly classified into the 3-electrode family using thin film transistors such as triodes and the 2-electrode family using nonlinear resistance elements such as diodes. The 2-electrode family is excellent in terms of structure and manufacturing method which are simple and easy.

The diode type, varistor type, MIM type, etc., are developed for the 2-electrode liquid crystal display panels; particularly, the MIM type has features of a simple structure and short manufacturing process.

High density and high definition are also required for liquid crystal display panels, so it is necessary to make the element area small.

For this purpose, ultramicro photo lithography and etching techniques used to manufacture LSIs or VLSIs of semiconductor integrated circuits can be used. Those skilled in the art focus on the use of MIM of simple structure as switching elements for a large area which also enable cost reduction.

Next, the MIM element structure effective for a large area or cost reduction is described in conjunction with the accompanying drawings.

FIG. 1 is a plan view showing the structure of a liquid crystal display using nonlinear resistance elements. FIG. 2 is a sectional view taken on line I–I' of FIG. 1. The liquid crystal display in the related art is described in conjunction with FIGS. 1 and 2.

As shown in FIG. 2, a first electrode 32 is formed on a first substrate 31 and a nonlinear resistance layer 33 is formed on the first electrode 32. Further, a second electrode 34 is formed on the nonlinear resistance layer 33, and the first electrode 32 and the second electrode 34 are opposite to each other via the nonlinear resistance layer 33 to make up a nonlinear resistance element 30. A part of the second electrode 34 also serves as a display electrode 35.

On a second substrate 36, a black matrix 37 (shielding layer) hatched in FIG. 1 is formed to prevent light from leaking from gaps in display electrodes 35 formed on the first substrate 31.

Further, on the second substrate 36, an opposite electrode 39 is formed so as to be opposite to the display electrode 35. The opposite electrode 39 is formed on the black matrix 37 via an insulating film 38 so as not to be in contact with the black matrix 37.

As shown in FIG. 1, the first electrode 32 formed on the first substrate 31 forms an overhanging area to form the nonlinear resistance element 30, and the overhang area overlaps with the second electrode 34 to form the nonlinear resistance element 30.

The first electrode 32 and the display electrode 35 have a given clearance between them.

The display electrode 35 and the opposite electrode 39 are positioned on the opposite sides so as to overlap each other, thereby making up a picture element part of a liquid crystal display panel.

The black matrix 37 is formed so as to project to the formation area of the display electrode 35 for the purpose of preventing light from leaking from the periphery of the display electrode 35.

The liquid crystal display performs predetermined display in response to a transmittance change of liquid crystal in an area in which the black matrix 37 on the display electrode 35 is not formed.

The first and second substrates 31 and 36 are formed each with an orientation film 40 as a processing layer to regularly arrange molecules of liquid crystal 41.

Further, a spacer 42 is provided to make the first and second substrates 31 and 36 opposite to each other at a predetermined interval, and liquid crystal 41 is enclosed between the first and second substrates 31 and 36.

The liquid crystal display, which does not emit light by itself, requires a display lighting section 45 as external light. The display lighting section 45 is disposed on the side of the second substrate 36 forming the black matrix 37.

Since the black matrix 37 is formed on the second substrate 36 opposite to the nonlinear resistance element 30, light is not emitted to the nonlinear resistance element 30.

FIG. 3 is a plan view showing the structure of a liquid crystal display using nonlinear resistance elements 7 having a form different from that of the nonlinear resistance element shown in FIGS. 1 and 2. FIG. 4 is a sectional view taken on line II–II' of FIG. 3. The liquid crystal display is described in conjunction with FIGS. 3 and 4, and parts identical with or similar to those previously described with reference to FIGS. 1 and 2 are denoted by the same reference numerals in FIG. 3 and 4 and will therefore not be discussed again.

A first electrode 32 is formed on a first substrate 31 and a nonlinear resistance layer 33 is formed on the first electrode 32. Further, a second electrode 34a is formed so as to overlap on the nonlinear resistance layer 33, and a nonlinear resistance element 30a is formed by using the side wall of the first electrode 32. A part of the second electrode 34a also serves as a display electrode 35.

When the nonlinear resistance element 30a is formed by using the side wall of the first electrode 32, the overlap portion of the first and second electrodes 32 and 34a via the nonlinear resistance layer 33, which is an insulating layer, reduces and the area of the nonlinear resistance element 30 can be made small. In addition, the parasitic capacitance of the element can be reduced.

A numeral 45 is a display lighting section similar to that in FIG. 2. Since it is disposed on the side of a second substrate 36, light is shielded by a black matrix 37, and light is not emitted to the nonlinear resistance element 30a.

Some nonlinear resistance elements show an asymmetrical change depending on the polarity of applied voltage. Characteristic examples of a nonlinear resistance element having the asymmetrical characteristic are given in conjunction with the accompanying drawings.

FIG. 5 is a graph showing voltage-current characteristics of nonlinear resistance elements each using tantalum (Ta) as a first electrode, tantalum oxide ($Ta_2O_5$) as a nonlinear resistance layer, and indium tin oxide (ITO), a transparent conducting film, as a second electrode.

In the graph of FIG. 5, curve L denotes the initial characteristic of the nonlinear resistance elements shown in FIGS. 2 and 4; curves M1 and M2 denote the characteristics after the nonlinear resistance elements shown in FIGS. 2 and 4 are driven respectively.

For the curves M1 and M2 showing the characteristics after the nonlinear resistance elements in FIGS. 2 and 4 are driven, when a positive voltage is applied to the first electrode of the nonlinear resistance element, the value of current that can flow into the nonlinear resistance element at the same voltage lowers greatly compared with that for the curve L indicating the initial characteristic.

For the curves M1 and M2 showing the characteristics after the nonlinear resistance elements in FIGS. 2 and 4 are driven, when a negative voltage is applied to the first electrode of the nonlinear resistance element, the value of current that can flow into the nonlinear resistance element at the same voltage lowers slightly compared with that for the curve L indicating the initial characteristic.

When the nonlinear resistance element is formed using the side wall of the first electrode as shown in FIGS. 3 and 4, the film quality of the nonlinear resistance layer of the side wall part is bad compared with the top of the first electrode, thus the characteristic change amount is greater than that of the nonlinear resistance element in FIG. 2.

Assume that P1 is the difference between the curve L indicating the initial characteristic when a positive voltage is applied to the first electrode (Ta) and the curve M1 indicating the characteristic after the nonlinear resistance element in FIG. 2 is driven and that P2 is the difference between the curve L and the curve M2 indicating the characteristic after the nonlinear resistance element in FIG. 4 is driven. Likewise, assume that Q1 is the difference between the curve L indicating the initial characteristic when a negative voltage is applied to the first electrode (Ta) and the curve M1 indicating the characteristic after the nonlinear resistance element in FIG. 2 is driven and that Q2 is the difference between the curves L and M2.

As seen in FIG. 5, the differences P1 and P2 when a positive voltage is applied to the first electrode are much greater than the differences Q1 and Q2 when a negative voltage is applied to the first electrode.

Further, FIG. 6 shows changes of the differences described with the graph in FIG. 5 according to the driving time.

In the graph in FIG. 6, curves R1 and R2 denote changes of the differences P1 and P2, respectively, when a positive voltage is applied to the first electrode according to the driving time; the current change values rise rapidly with the driving time.

In contrast, curves S1 and S2 denote changes of the differences Q1 and Q2, respectively, when a negative voltage is applied to the first electrode according to the driving time; the amount of current changes only a little although the driving time increases.

The changes are denoted by the difference between the curves R1 and S1, U1, and between the curves R2 and S2, U2; the differences U1 and U2 increase rapidly as the driving time is prolonged.

The differences U1 and U2 change depending on the current amount flowing into the nonlinear resistance elements, the environment in which the nonlinear resistance elements are driven, and the history of the nonlinear resistance elements in addition to the driving time described with FIG. 6.

Thus, it is extremely difficult to compensate for the changes of the differences U1 and U2.

Since the differences U1 and U2 occur, the voltage applied to a liquid crystal picture element, when a positive voltage is applied to the first electrode of the nonlinear resistance element shown in FIG. 2, 4, differs from that when a negative voltage is applied to it. Thus, DC voltage is applied to liquid crystal and ions in the liquid crystal are biased. If a fixed pattern is displayed for a long time, a burn phenomenon of an image, a residual image phenomenon, occurs in which the pattern is seen as a residual image if the screen is changed. In addition, image flickering occurs and the display quality of the liquid crystal display degrades remarkably.

Although the area occupied by the nonlinear resistance element 30a shown in FIG. 4 can be made small by using the nonlinear resistance layer formed on the side wall of the first electrode 32, symmetry of characteristic change is bad, causing the display quality of the liquid crystal display to degrade.

SUMMARY OF THE INVENTION

Accordingly, it is an object of the invention to provide a liquid crystal display having a good image quality by suppressing asymmetry of characteristic changes of nonlinear resistance elements, made according to the polarity of applied voltage, reducing application of DC voltage to liquid crystal, and preventing contrast from degrading and a flicker phenomenon and an image burn phenomenon from occurring.

To this end, according to one embodiment of the invention, there is provided a liquid crystal display comprising:

a first substrate and a second substrate between which liquid crystal is held;

a first electrode and a second electrode formed separately on the first substrate;

a nonlinear resistance element formed by disposing the first and second electrodes opposite to each other through an insulating film; and light emission means being disposed on either side of the first and second substrates for emitting light to the nonlinear resistance element area.

Light may be emitted from the side of the second substrate by the light emission means.

Preferably, the quantity of light emitted from the light emission means to the nonlinear resistance element is 5000 lux or more.

When light is emitted from the side of the second substrate, preferably a shielding layer is formed at a predetermined position on the second substrate and the shielding layer is provided with an aperture in an area opposite to the nonlinear resistance element on the first substrate.

Either a color filter or combination of some color filters may be formed in the aperture.

Preferably, the color filter formed in the aperture is blue.

Shielding parts may be located at the periphery of the nonlinear resistance element on the first substrate.

The shielding parts located at the periphery of the nonlinear resistance element on the first substrate may be made of the same material as the first or second electrode.

Preferably, the first electrode is made of tantalum and the second electrode being opposite to the first electrode through tantalum oxide formed by anodic oxidation of the tantalum is made of a transparent conducting film, chromium, or a lamination layer of chromium and a transparent conducting film.

According to another embodiment of the invention, there is provided a liquid crystal display comprising:

a first substrate and a second substrate between which liquid crystal is held;

a first electrode and a second electrode formed separately on the first substrate;

a nonlinear resistance element formed by disposing the first and second electrodes opposite to each other through an insulating film; and light emission means being disposed on the side of the first substrate for emitting light to the nonlinear resistance element area, wherein light is emitted to the nonlinear resistance element area from the side of the first substrate.

Preferably, the first electrode is made of tantalum and the second electrode being opposite to the first electrode through tantalum oxide formed by anodic oxidation of the tantalum is made of a transparent conducting film, chromium, or a lamination layer of chromium and a transparent conducting film.

Preferably, the quantity of light emitted from the light emission means to the nonlinear resistance element is 5000 lux or more.

Preferably, the first electrode has a film thickness through which light of 5000 lux or more can be passed.

Preferably, the film thickness of the first electrode is 60 nm or less.

Light reflection parts for focusing light on the nonlinear resistance element may be disposed in the periphery of the nonlinear resistance element on the first substrate.

The light reflection parts may be made of the same material as the first or second electrode.

A member substantially like a dome for focusing light on the nonlinear resistance element may be disposed on the nonlinear resistance element and at its periphery.

Light reflection parts and a dome-like member for focusing light on the nonlinear resistance element may be disposed at the periphery of the nonlinear resistance element.

Preferably, the dome-like member for focusing light on the nonlinear resistance element is made of polyimide.

When light is emitted to the nonlinear resistance elements shown in FIGS. 2 and 4, how the current-voltage characteristics of the nonlinear resistance elements change is described with reference to FIG. 7.

In FIG. 7, curves D1 and D2 denote dependencies of the differences P1 and P2 between the curve L indicating the initial characteristic when a positive voltage is applied to the first electrode (Ta) of the nonlinear resistance element and the curves M1 and M2 indicating the characteristics after the nonlinear resistance elements are driven, shown in FIG. 5, on the quantity of light emitted to the nonlinear resistance elements. Curves E1 and E2 denote dependencies of the differences Q1 and Q2 between the curve L indicating the initial characteristic when a negative voltage is applied to the first electrode (Ta) of the nonlinear resistance element and the curves M1 and M2 indicating the characteristics after the nonlinear resistance elements are driven, on the quantity of light emitted to the nonlinear resistance elements.

As seen in the graph of FIG. 7, both the curves D1 and D2 indicating the state in which a positive voltage is applied to the first electrode decrease rapidly as the quantity of light emitted to the nonlinear resistance element exceeds 1000 lux.

In contrast, the curves E1 and E2 indicating the state in which a negative voltage is applied to the first electrode decrease gradually with an increase in the quantity of light emitted to the nonlinear resistance element; compared with the curves D1 and D2, the change amounts are extremely small up to about 5000 lux.

When the differences between the curves D1 and D2 and the curves E1 and E2, F1 and F2, are large, an asymmetrical voltage is applied to liquid crystal according to the polarity of voltage applied to the first electrode, resulting in a flicker phenomenon or an image burn phenomenon, also called a residual image phenomenon.

Further, as seen in the graph of FIG. 7, if an amount of light exceeding 5000 lux is emitted to the nonlinear resistance element, the differences of D1–E1 and D2–E2 (asymmetrical change amounts according to the polarity of voltage emitted to the first electrode), F1 and F2, can be made extremely small.

Thus, while light of about 5000 lux is being emitted to the nonlinear resistance elements, the liquid crystal display is driven, thereby enabling symmetrical characteristic changes of the nonlinear resistance elements to be made extremely small.

In the invention, any desired amount of light is emitted to the nonlinear resistance elements, thus application of DC voltage to the liquid crystal can be reduced, thereby preventing the quality of the liquid crystal and contrast from degrading and flicker and image burn phenomena from occurring. Therefore, the liquid crystal display having a good image quality can be provided.

DESCRIPTION OF THE PREFERRED EMBODIMENTS

Figure 8:
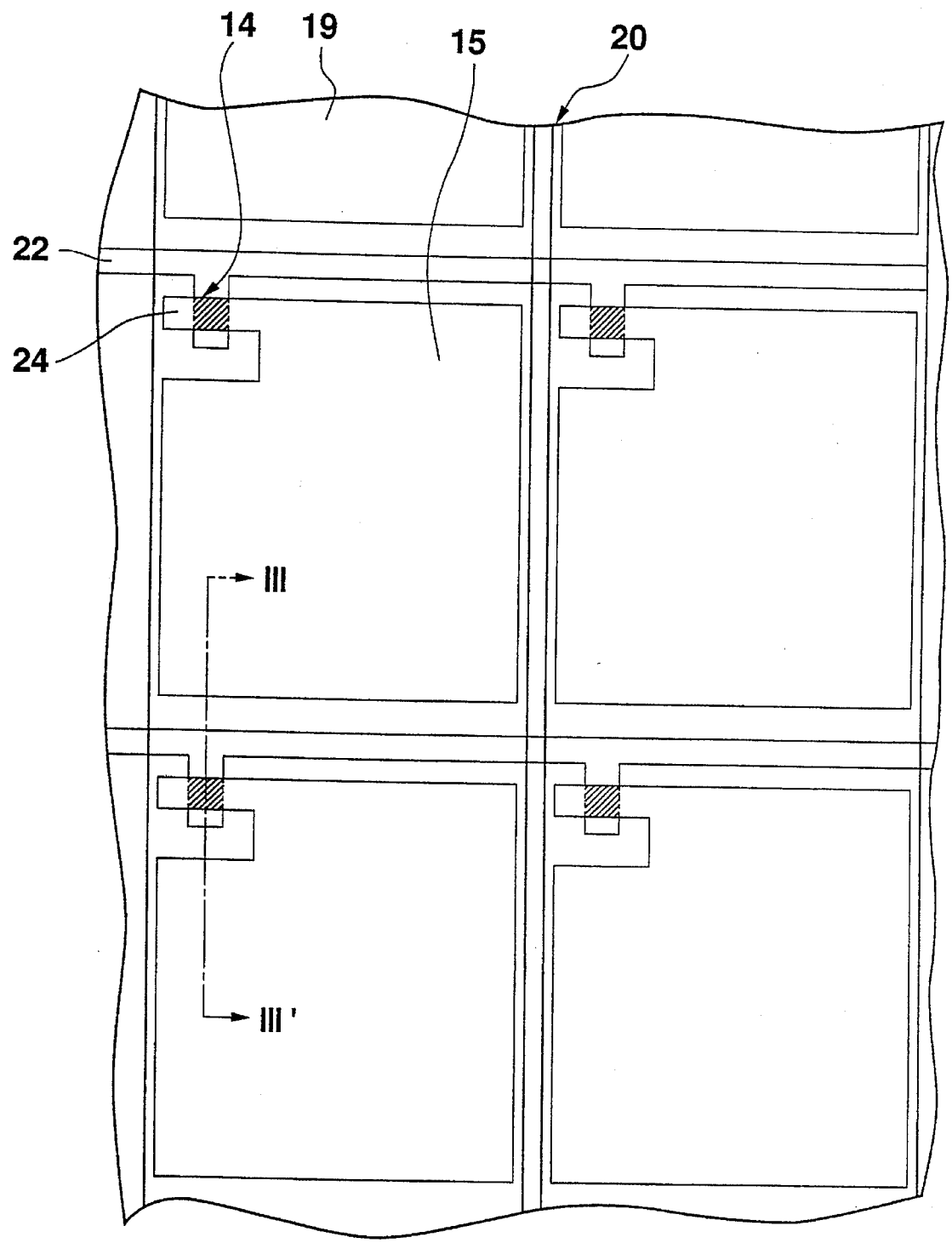
FIG. 8 is a plan view showing a liquid crystal display according to a first embodiment of the invention.
Figure 9:
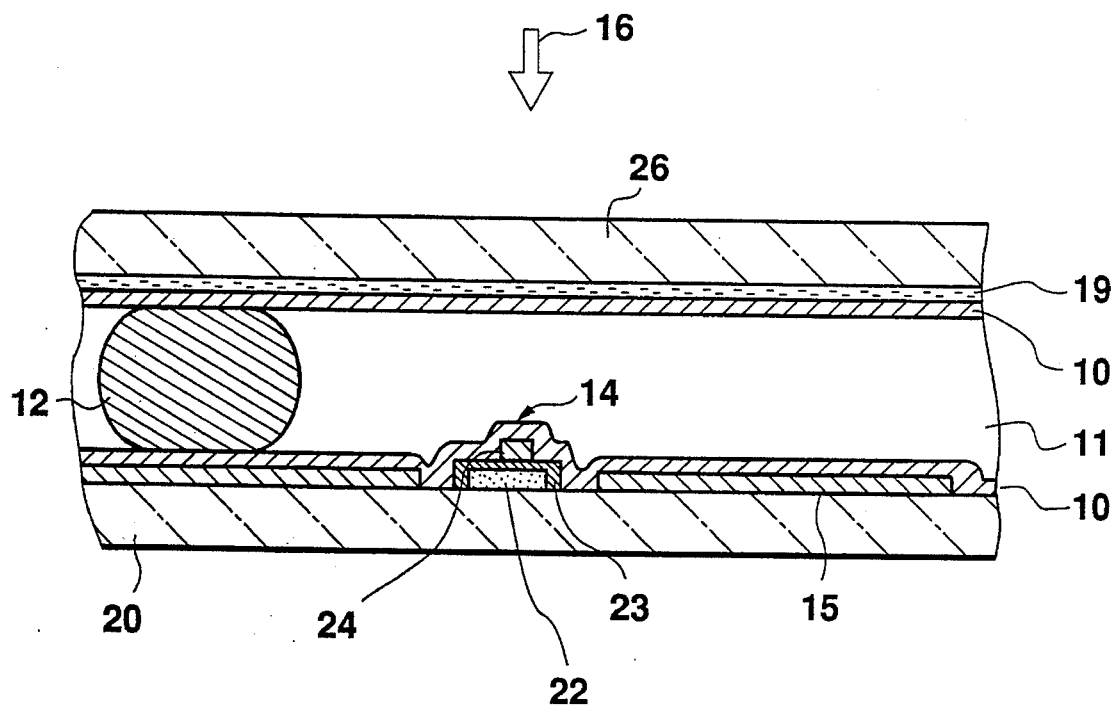
FIG. 9 is a sectional view taken on line III–III' of FIG. 8.

Referring now to the accompanying drawings, there are shown preferred embodiments of the invention.
First embodiment:

FIG. 8 is a plan view showing a liquid crystal display according to a first embodiment of the invention. FIG. 9 is a sectional view taken on line III–III' of FIG. 8. The liquid crystal display according to the first embodiment of the invention is described in conjunction with FIGS. 8 and 9.

As shown in FIG. 9, a first electrode 22 made of tantalum (Ta) is formed on a first substrate (insulator) 20 such as glass, and a nonlinear resistance layer (insulator) 23 and made of tantalum oxide ($Ta_2O_5$) formed by performing an anodic oxidation treatment of the first electrode 22 is formed on the first electrode 22.

Further, a second electrode 24 made of ITO (indium tin oxide) as a transparent conducting film is formed on the nonlinear resistance layer 23.

The overlap portion of the first and second electrodes 22 and 24 via the nonlinear resistance layer 23 forms a nonlinear resistance element 14 of a MIM structure.

As shown in the plan view of FIG. 8, a partial area of the second electrode 24 also serves as a display electrode 15.

Further, on a second substrate 26, an opposite lectrode 19 made of an ITO film is formed so as to be opposite to the display electrode 15. The opposite electrode 19 is made of a transparent conducting film of ITO.

As shown in FIG. 8, the first electrode 22 and the display electrode 15 have a given clearance between them so as not to short circuit them.

The display electrode 15 and the opposite electrode 19 are positioned on opposite sides so as to overlap each other, thereby making up a picture element part of a liquid crystal display panel.

The liquid crystal display performs predetermined image display in response to a transmittance change of liquid crystal 11 of the picture element part.

The first and second substrates 20 and 26 are each formed with an orientation film 10 as a processing layer to regularly arrange molecules of liquid crystal 11. Further, a spacer 12 is provided to make the first and second substrates 20 and 26 opposite to each other at a predetermined interval, and liquid crystal 11 is enclosed between the first and second substrates 20 and 26.

The liquid crystal display, which does not emit light by itself, requires a display lighting section 16 as external light.

Light emission means for emitting light to the nonlinear resistance element 14 of the liquid crystal display according to the embodiment is configured as described below: The second substrate 26 is disposed on the side of the display lighting section 16 which consists of, for example, a 3-band fluorescent lamp, a reflection board, and a diffusion board. The opposite electrode 19 is made of a transparent conducting film through which light from the display lighting section 16 is passed. Further, the second electrode 24 is made of a transparent conducting film through which the light passed through the opposite electrode 19 from the display lighting section 16 is passed. Therefore, light can be easily emitted to at least one of the interfaces of the first electrode 22, second electrode 24, and nonlinear resistance layer 23 of the nonlinear resistance element 14 (M-I interfaces).

Figure 10:
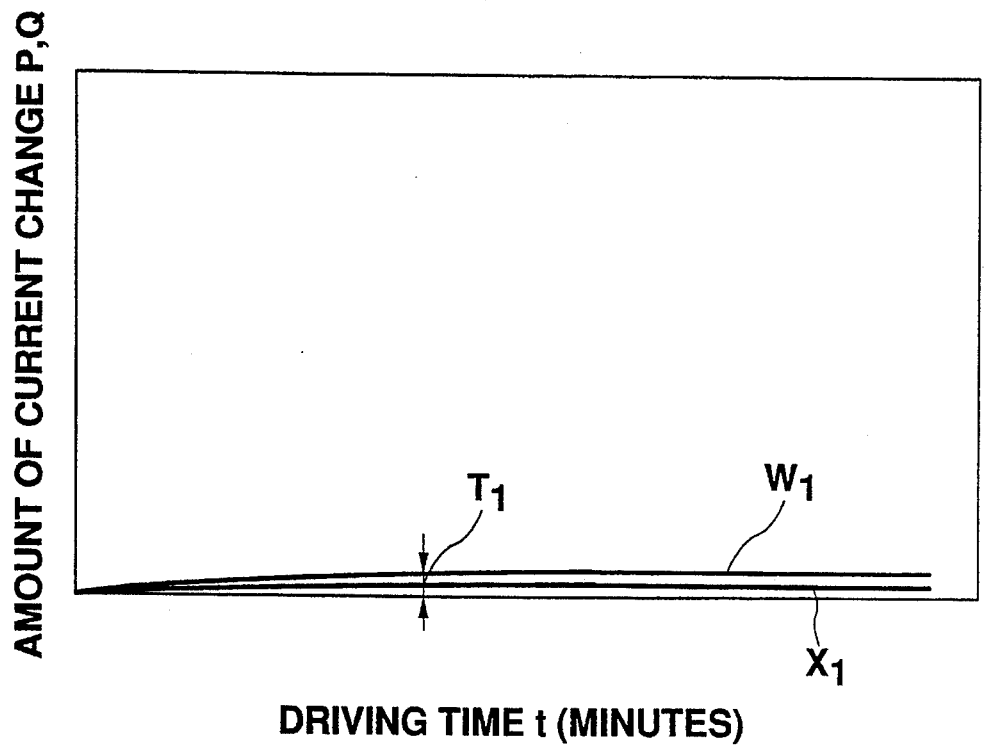
FIG. 10 is a graph showing the relationships between change amounts of current values according to the voltage polarity and the driving time of a nonlinear resistance element of the liquid crystal display according to the first embodiment of the invention when light is emitted to the nonlinear resistance element.

When the nonlinear resistance element 14 in the embodiment is driven while light of 5000 lux is being emitted thereto, the relationship between the driving time (t) and change amounts of current (P and Q) is described with FIG. 10.

The curve W1 shown in FIG. 10 denotes the dependency of the change amount of current (P1) indicating the difference between the initial characteristic when a positive voltage is applied to the first electrode (Ta) 22 of the nonlinear resistance element 14 in the embodiment shown in FIG. 9 and the characteristic after it is driven, on the driving time (t). In contrast, the curve X1 denotes the dependency of the change amount of current (Q1) indicating the difference between the initial characteristic when a negative voltage is applied to the first electrode (Ta) 22 and the characteristic after it is driven, on the driving time (t).

As shown in the graph of FIG. 10, the curve W1 indicating the state in which a positive voltage is applied to the first electrode 22 means that the change amount of current increases only a little with an increase in the driving time; the curve X1 indicating the state in which a negative voltage is applied to the first electrode 22 means that the change amount of current is extremely small as the driving time increases.

The difference between the curves W1 and X1, T1, remains substantially unchanged although the driving time is increased.

Figure 1:
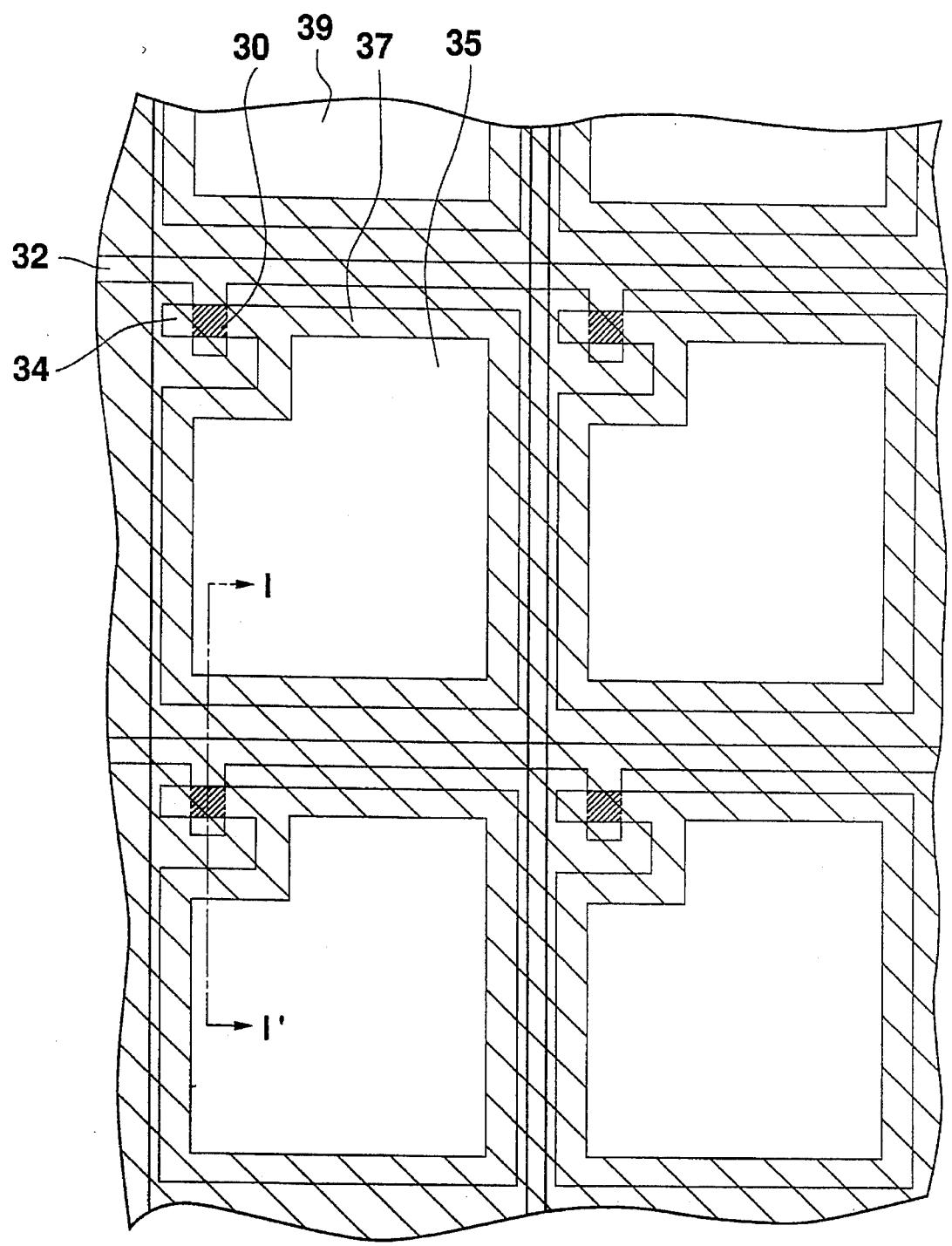
FIG. 1 is a plan view showing a liquid crystal display in the related art.
Figure 2:
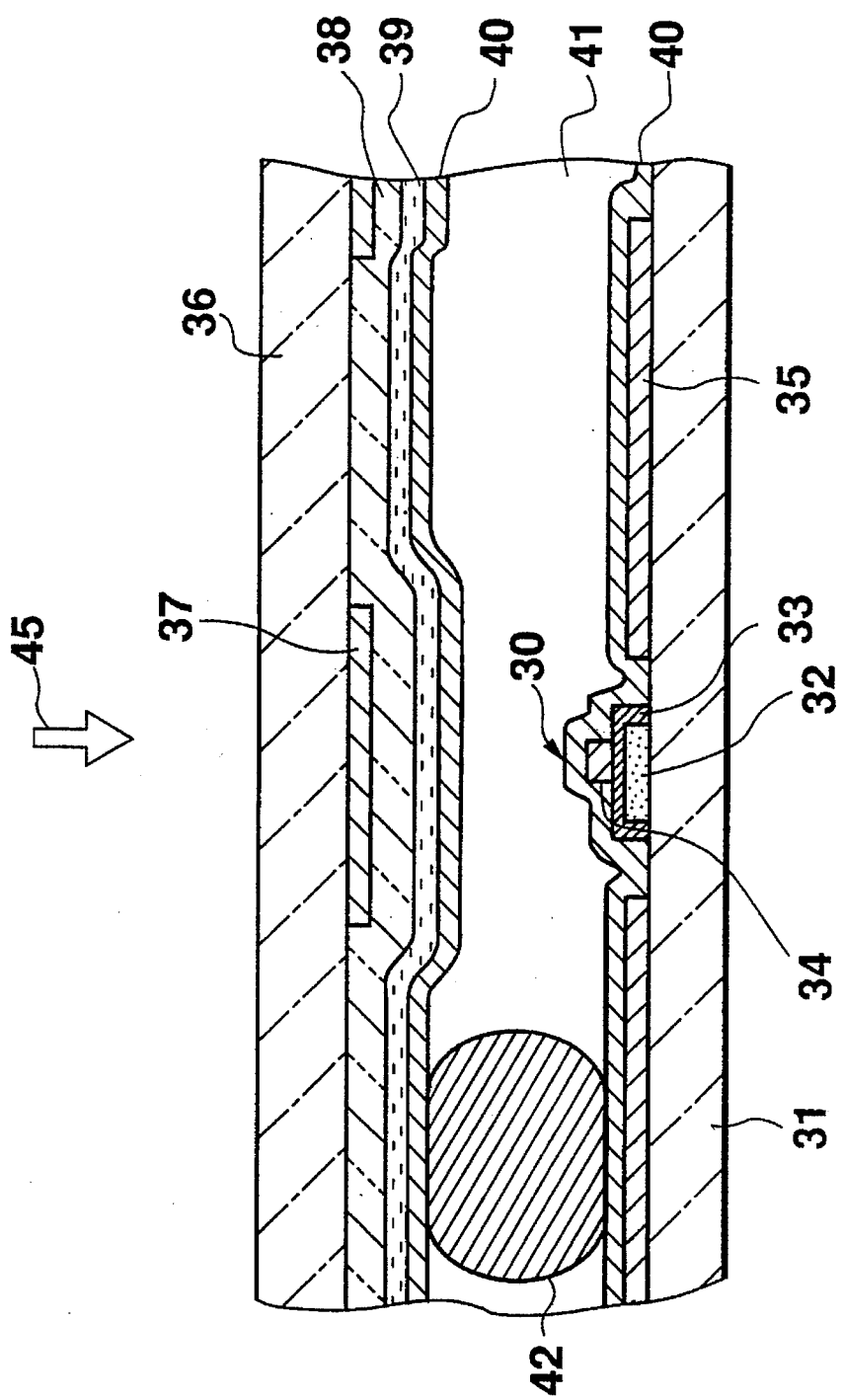
FIG. 2 is a sectional view taken on line I–I' of FIG. 1.
Figure 3:
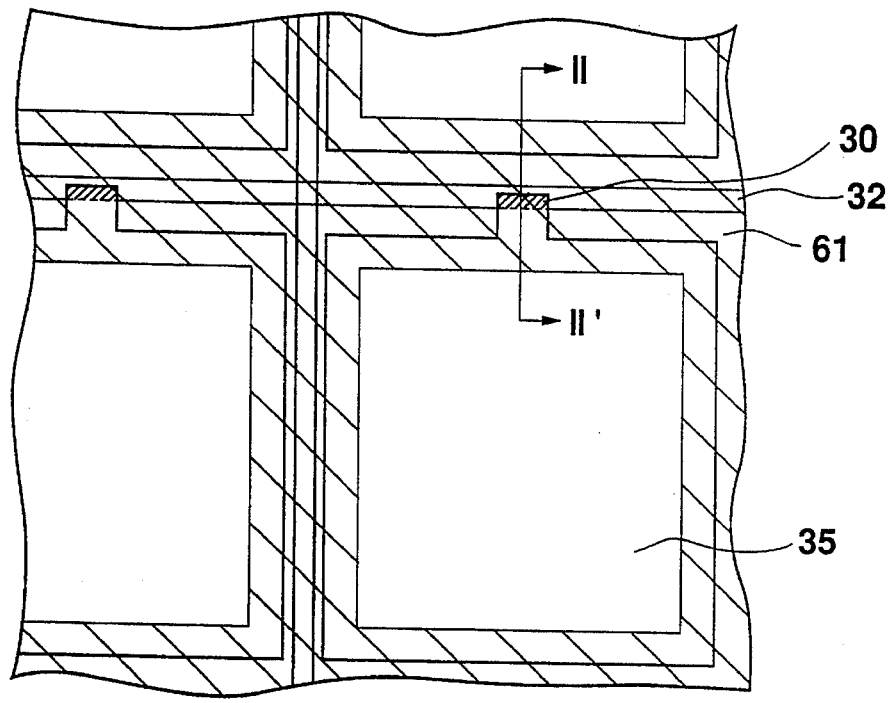
FIG. 3 is a plan view showing another liquid crystal display in the related art.
Figure 4:
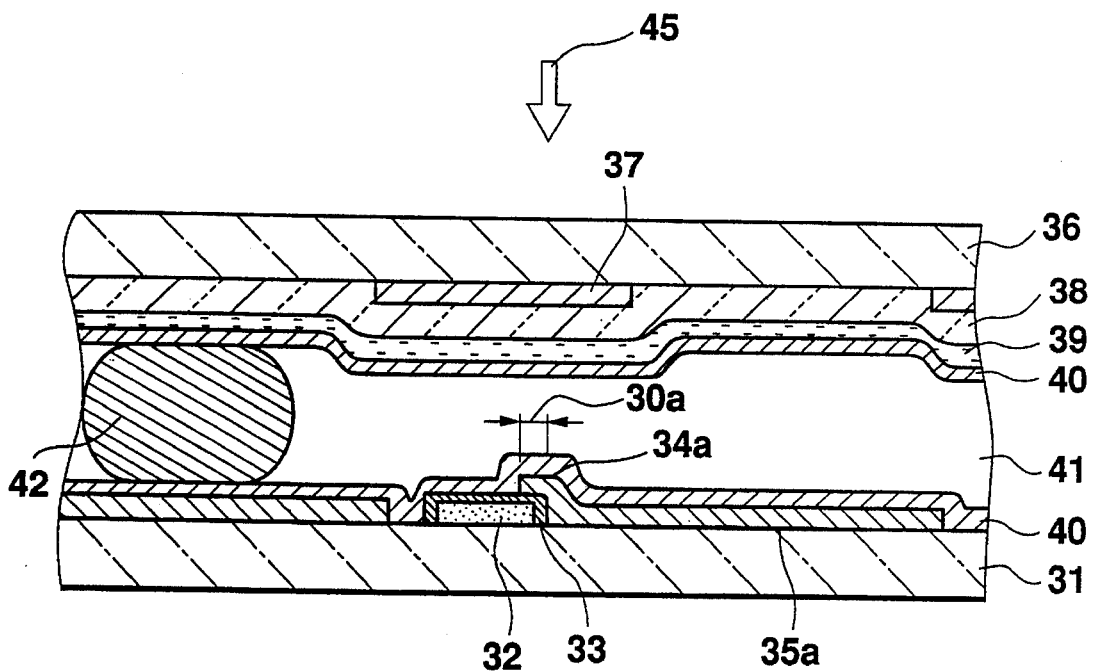
FIG. 4 is a sectional view taken on line II–II' of FIG. 3.
Figure 5:
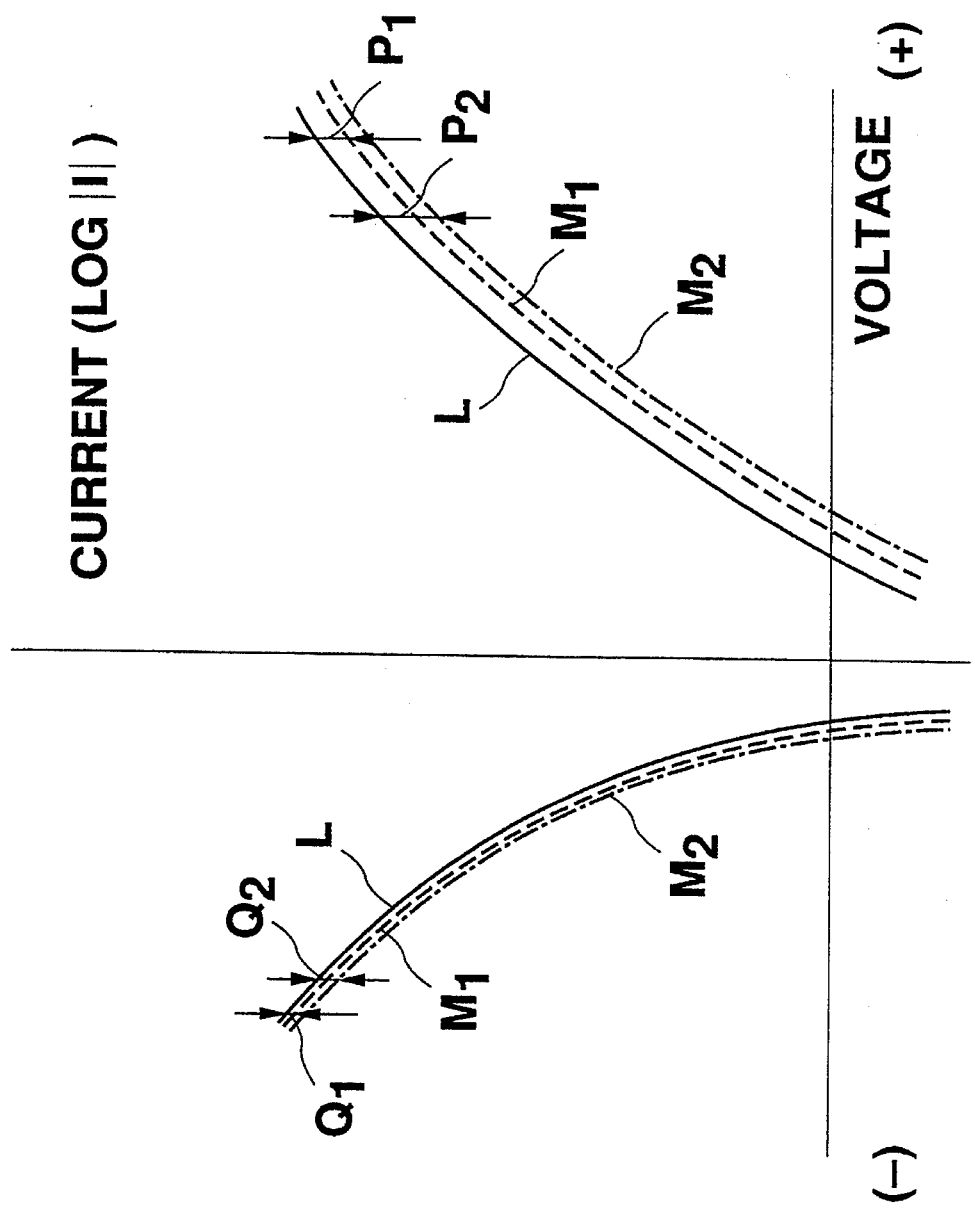
FIG. 5 is a graph showing a voltage-current characteristic of nonlinear resistance elements of a liquid crystal display.
Figure 6:
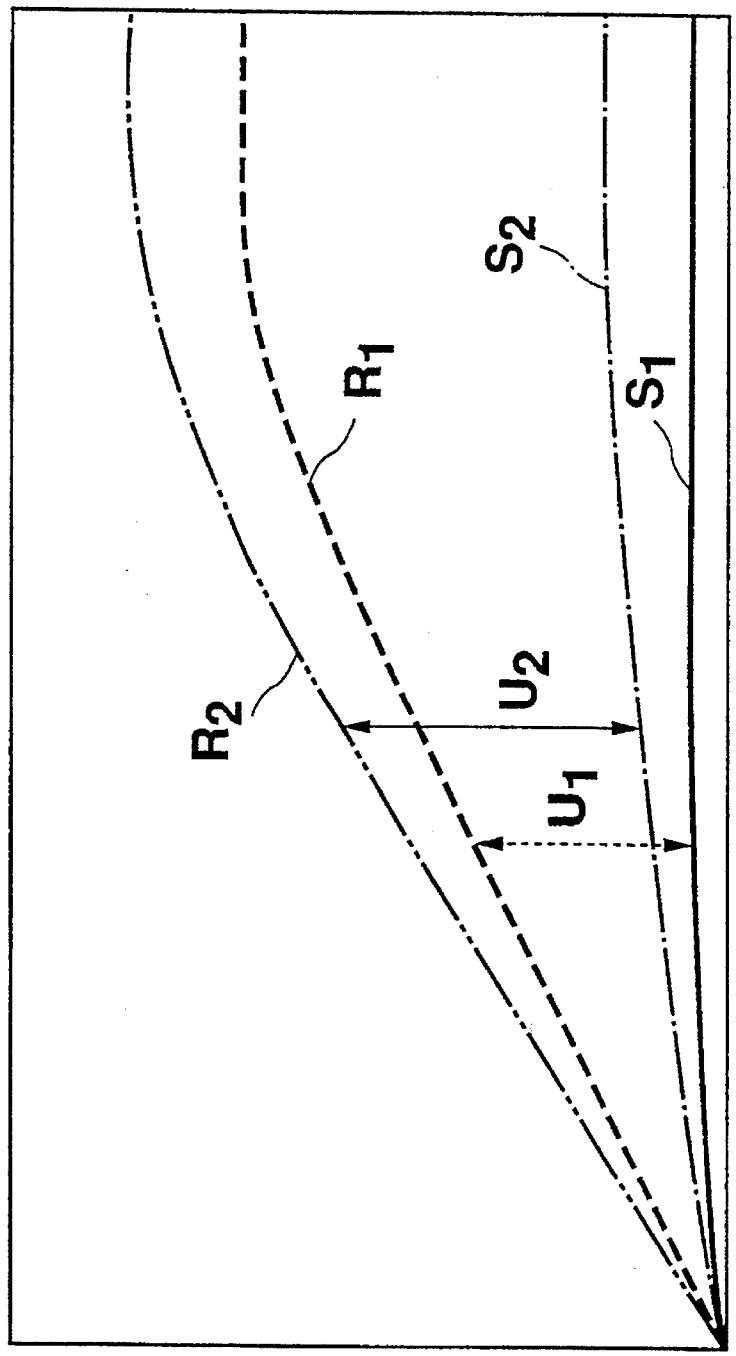
FIG. 6 is a graph showing the relationships between the driving time and characteristic changes of nonlinear resistance elements of the liquid crystal display when no light is emitted thereto.
Figure 7:
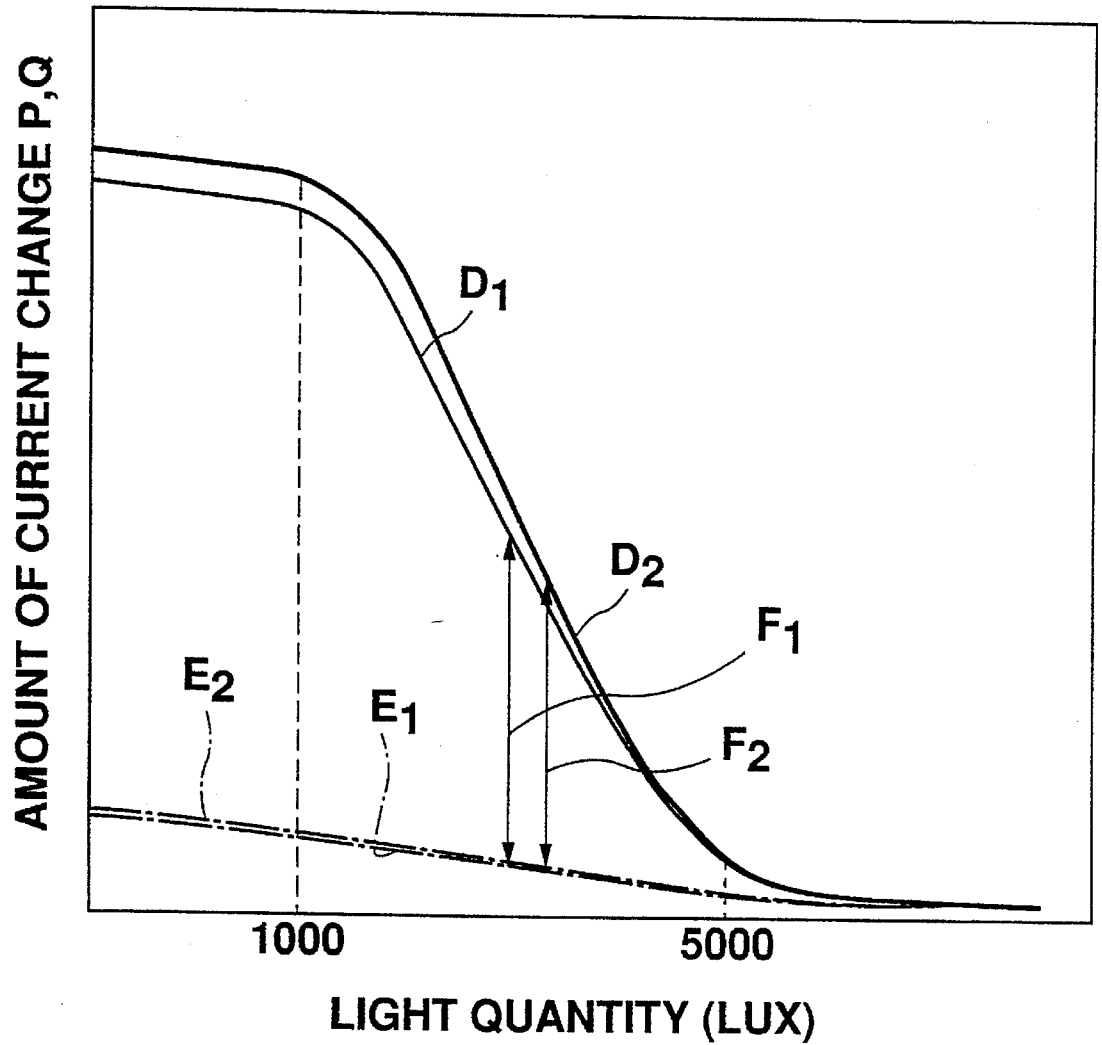
FIG. 7 is a graph showing the relationships between change amounts of current values according to the voltage polarity at the initial stage and after driving of nonlinear resistance elements of the liquid crystal display and quantities of light emitted to the nonlinear resistance elements.

It is easy to obtain a transmittance of 80% or more by forming the second electrode 24, a component of the nonlinear resistance element 14, shown in FIG. 9, with a transparent conducting film. The light quantity of about 5000 lux required for an improvement in the asymmetrical characteristic change of the nonlinear resistance element as shown in FIG. 7 is a quality of light that can be easily emitted to the nonlinear resistance element 14 by the display lighting section 16 of back light type if the liquid crystal display uses the display lighting section 16 of back light type.

Since dark display is made by a color liquid crystal display having a color filter, a lighter display lighting section is used as the display lighting section 16. Therefore, the light quantity of about 5000 lux can be more easily obtained.

As described above, a change in the element characteristics can be made small by emitting light to the nonlinear resistance element 14.

Further, the asymmetrical nonlinear resistance element characteristic change made according to the polarity of driving voltage in the current-voltage characteristic can be made small. Thus, a display quality change made by driving the liquid crystal display and a flicker phenomenon and an image burn phenomenon caused by applying a DC voltage to the liquid crystal can be reduced.

Further, an ITO film as a transparent conducting film having a high light transparency characteristic is used for the second electrode 24, a component of the nonlinear resistance element 14, and a metal film made of tantalum having a high light reflection characteristic is used for the first electrode 22. Thus, light can be emitted efficiently to the nonlinear resistance element 14.

In the embodiment, no black matrix is formed at the peripheral area of the picture element part of the liquid crystal display panel. Thus, although the contrast reduces slightly, a bright display is possible.

Figure 11:
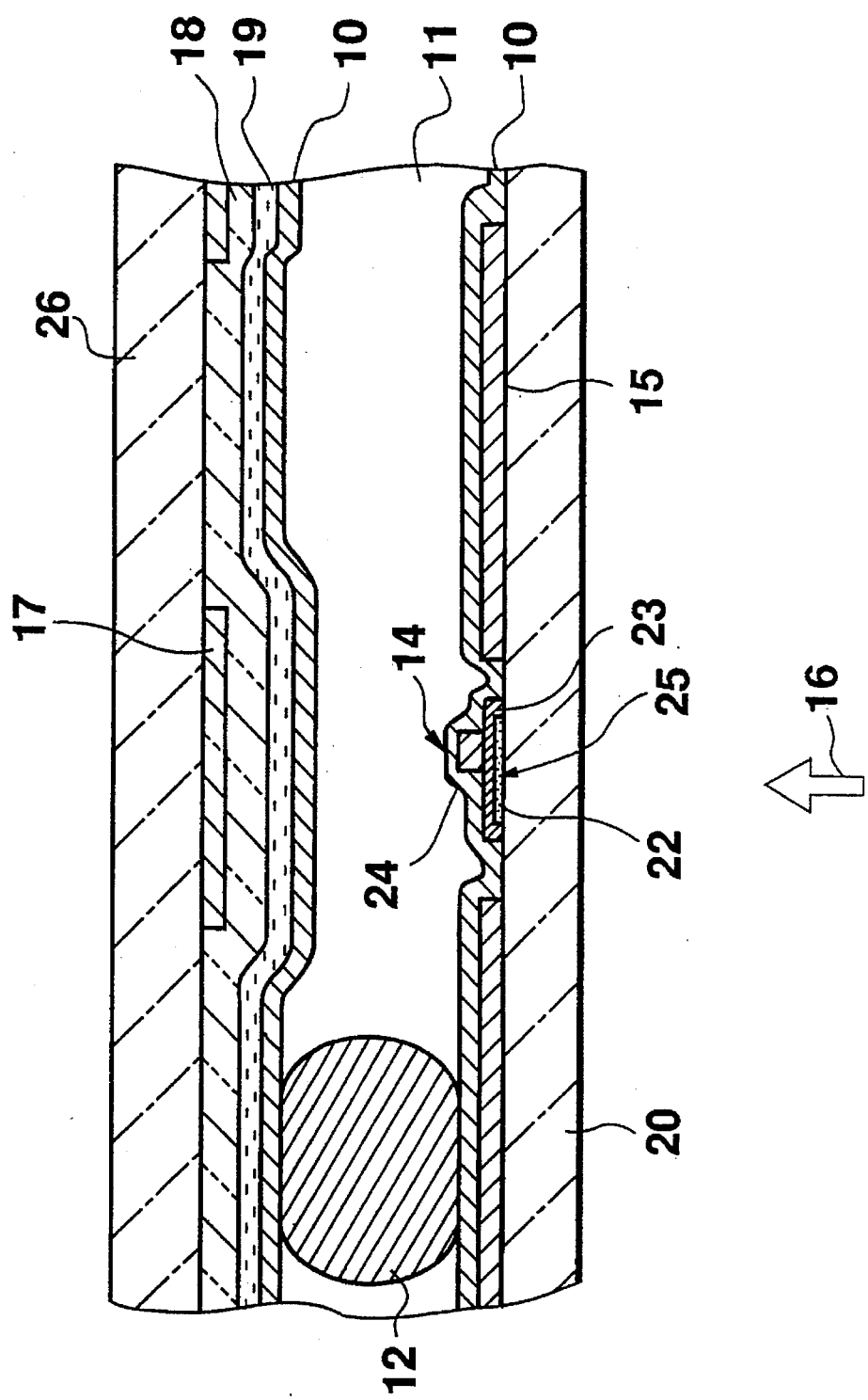
FIG. 11 is a sectional view showing a liquid crystal display according to a second embodiment of the invention.

Second embodiment:

Next, a liquid crystal display according to a second embodiment of the invention will be described. FIG. 11 is a plan view showing the liquid crystal display according to the second embodiment of the invention. Members identical with or similar to those previously described with reference to FIGS. 8 and 9 are denoted by the same reference numerals in FIG. 11.

As shown in FIG. 11, in the second embodiment of the invention, the film thickness of a first electrode 22 made of tantalum is made thin to make a thin film of tantalum 25. Light from a display lighting section 16 disposed on the side of a first substrate 20 is passed through the first electrode 22 for emission to the M-I interface of a nonlinear resistance element 14.

Figure 12:
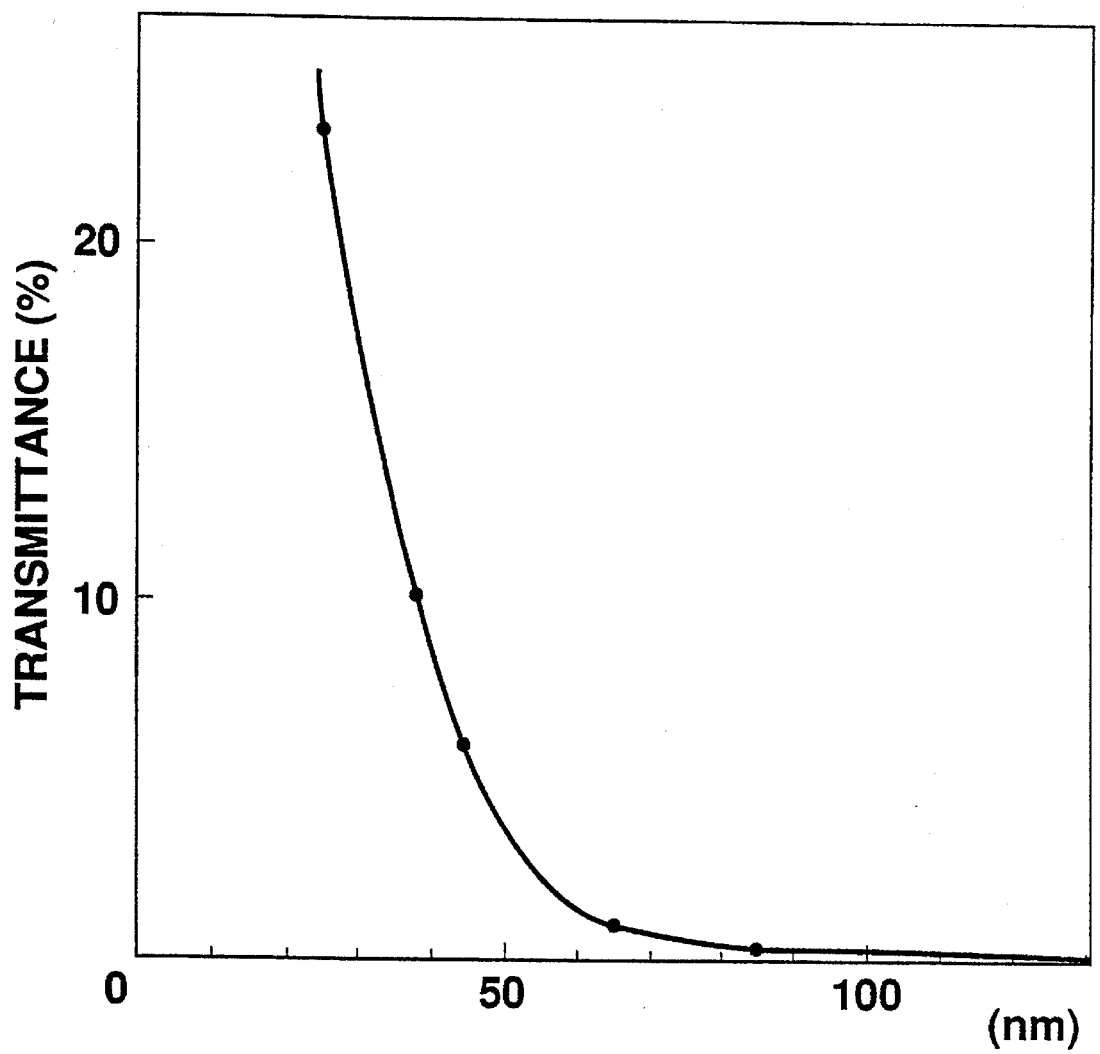
FIG. 12 is a Graph showing the relationship between the film thickness and transmittance of tantalum.

The graph of FIG. 12 shows the relationship between the film thickness of tantalum in nanometer units and the light transmittance of tantalum in percent units. When the film thickness of tantalum is 0 nm, the transmittance is 100%; the transmittance is dependent on the thickness of the tantalum film. The measurement wavelength ranges from 450 nm to 500 nm.

As can be seen in the graph of FIG. 12, when the film thickness of tantalum is 25 nm, the transmittance of 25% is obtained.

In the second embodiment of the invention, the thin film of tantalum 25 having the film thickness of 60 nm is formed as the first electrode 22 formed on the first substrate 20, as shown in FIG. 11.

Further, a nonlinear resistance layer 23 made of tantalum oxide formed by an anodic oxidation treatment of the thin film of tantalum 25 is formed with the film thickness of 65 nm on the thin film of tantalum 25. The thickness of the thin film of tantalum 25 decreases by forming the tantalum oxide, and the film thickness 60 nm described above reduces to 25 nm after the anodic oxidation treatment.

As a second electrode 24, a transparent conducting film of ITO, etc., is formed so as to overlap the nonlinear resistance layer 23 to form a nonlinear resistance element 14 of a MIM structure.

A part of the second electrode 24 also serves as a display electrode 15.

On a second substrate 26, a black matrix 17 is formed to prevent light from leaking from gaps in display electrodes 15 formed on the first substrate 20.

On the second substrate 26, an opposite electrode 19 is formed with a transparent conducting film of ITO, etc., so as to be opposite to the display electrode 15. The opposite electrode 19 is formed via an insulating film 18 so as not to be in contact with the black matrix 17.

Further, the thin film of tantalum 25 and the display electrode 15 have a given clearance between them so as not to be in contact with each other.

The display electrode 15 and the opposite electrode 19 are positioned on the opposite sides so as to overlap each other, thereby making up a picture element part of a liquid crystal display panel.

The black matrix 17 is formed so as to project to the formation area of the display electrode 15 for preventing light from leaking from the peripheral area of the display electrode 15.

The liquid crystal display performs predetermined display in response to a transmittance change of liquid crystal in an area in which the black matrix 17 on the display electrode 15 is not formed.

The first and second substrates 20 and 26 are each formed with an orientation film 10 as a processing layer to regularly arrange molecules of liquid crystal 11.

Further, a spacer 12 is provided to make the first and second substrates 20 and 26 opposite to each other at a predetermined interval, and liquid crystal 11 is enclosed between the first and second substrates 20 and 26.

Light can be emitted efficiently to the nonlinear resistance element 14 by disposing the display lighting section 16 on the side of the first substrate 20 where the thin film of tantalum 25 is formed.

The first electrode 22 is made thin to form the thin film of tantalum 25 in FIG. 11, thereby raising the light transmittance of tantalum as shown in FIG. 12, thus enabling light of the display lighting section 16 to be emitted particularly to the M-I interface of the nonlinear resistance element 14.

In the second embodiment of the invention, lighting of about 20000 lux is used as the display lighting section 16. The light quantity is normal for a lighting section of a liquid crystal display.

Since the first electrode 22 is formed with the thin film of tantalum 25 having the film thickness 25 nm, as shown in FIG. 12, light of 5000 lux can be emitted particularly to the M-I interface of the nonlinear resistance element 14 by using the display lighting section 16. Therefore, the nonlinear resistance element characteristic change can also be made small by applying the second embodiment of the invention using the thin film of tantalum 25.

Further, the asymmetrical nonlinear resistance element characteristic change made according to the polarity of driving voltage in the current-voltage characteristic can be made small. Thus, a display quality change made by driving the liquid crystal display and a flicker phenomenon and an image burn phenomenon caused by applying DC voltage to the liquid crystal can be reduced. In the second embodiment of the invention described in conjunction with FIG. 11, the black matrix 17 formed on the second substrate 26 need not necessarily be formed.

Figure 13:
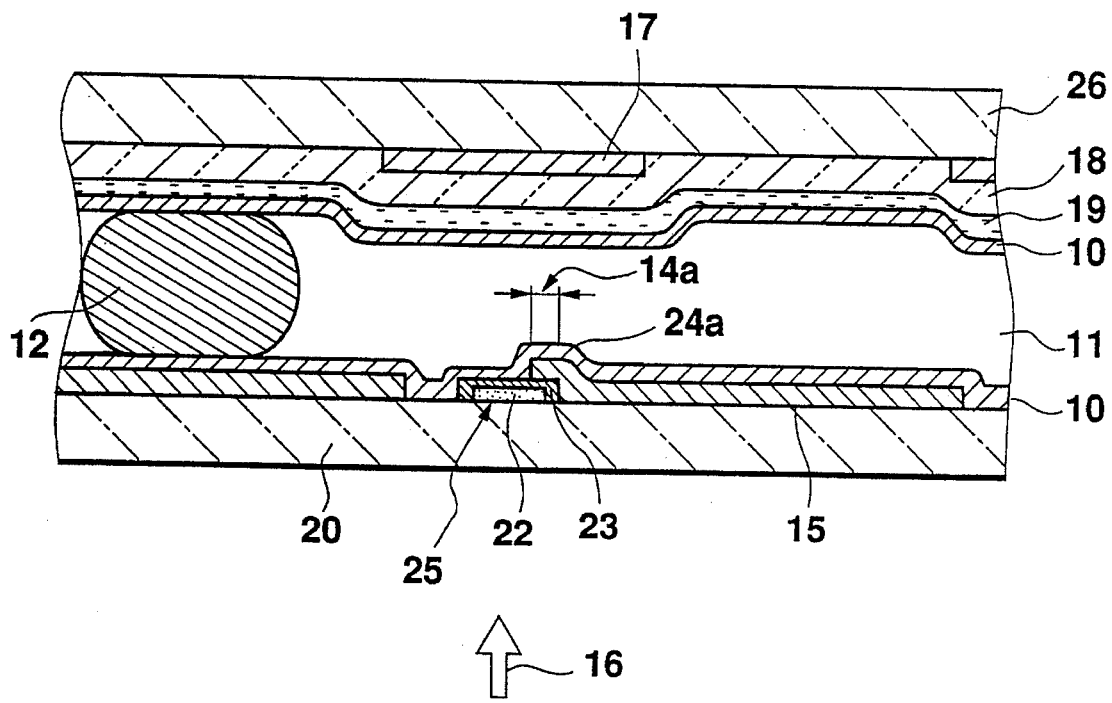
FIG. 13 is a sectional view showing a liquid crystal display according to a third embodiment of the invention.

Third embodiment:

A liquid crystal display according to a third embodiment of the invention will now be described. The liquid crystal display has nonlinear resistance elements of a structure different from that in the second embodiment. FIG. 13 is a plan view showing the liquid crystal display according to the third embodiment of the invention. Members identical with or similar to those previously described with reference to FIG. 11 are denoted by the same reference numerals in FIG. 13.

In the third embodiment of the invention, a thin film of tantalum 25 having the film thickness of 60 nm is formed as a first electrode 22 formed on a first substrate 20, as shown in FIG. 13.

Further, a nonlinear resistance layer 23 made of tantalum oxide formed by an anodic oxidation treatment of the first electrode 22 is formed with the film thickness of 65 nm on the first electrode 22 which is the thin film of tantalum 25. The film thickness of the first electrode 22 decreases by forming the tantalum oxide, and the thickness 60 nm described above reduces to 25 nm after the anodic oxidation treatment; the thickness 25 nm enables the light transmittance of substantially 25% to be obtained as shown in FIG. 12.

As a second electrode 24a, a transparent conducting film of ITO, etc., is formed so as to overlap the side wall of the first electrode 22 covered by tantalum oxide 23 to form a nonlinear resistance element 14a. A part of the second electrode 24a made of the transparent conducting film also serves as a display electrode 15.

On a second substrate 26, a black matrix 17 is formed to prevent light from leaking from gaps in display electrodes 15 formed on the first substrate 20.

On the second substrate 26, an opposite electrode 19 is formed with a transparent conducting film of ITO, etc., so as to be opposite to the display electrode 15. The opposite electrode 19 is formed via an insulating film 18 so as not to be in contact with the black matrix 17.

Further, the first electrode 22 made of the thin film of tantalum and the display electrode 15 have a given clearance between them so as not to be in contact with each other.

The display electrode 15 and the opposite electrode 19 are disposed so as to overlap each other, thereby making up a picture element part of a liquid crystal display panel.

The black matrix 17 is formed so as to project to the formation area of the display electrode 15 for the purpose of preventing light from leaking from the peripheral area of the display electrode 15.

The liquid crystal display performs predetermined display in response to a transmittance change of liquid crystal in an area in which the black matrix 17 on the display electrode 15 is not formed.

The first and second substrates 20 and 26 are each formed with an orientation film 10 as a processing layer to regularly arrange molecules of liquid crystal 11. Further, a spacer 12 is provided to make the first and second substrates 20 and 26 opposite to each other at a predetermined interval, and liquid crystal 11 is enclosed between the first and second substrates 20 and 26.

Light can be emitted efficiently to the nonlinear resistance element 14a by disposing a display lighting section 16 on the side of the first substrate 20 where the first electrode 22 made of the thin film tantalum 25 is formed.

The second electrode 24a overlaps not only the side wall area of the first electrode 22 covered by the nonlinear resistance layer 23 made of the tantalum oxide, but also the top of a small area of the first electrode 22. Thus, the side wall area of the first electrode 22 and the small area on the top of the first electrode 22 are used to form a nonlinear resistance element 14a.

As can be seen in FIG. 12, the film thickness of tantalum, of which the first electrode 22 is made, is made thin, thereby raising the light transmittance of tantalum, thus enabling light from the display lighting section 16 to be emitted particularly to the M-I interface on the top of the nonlinear resistance element 14a formed on the side wall and top of the first electrode 22 made of the thin film of tantalum 25.

In the third embodiment of the invention, lighting of about 20000 lux is used as the display lighting section 16 for supplying light to the M-I interface of the nonlinear resistance element 14a. The light quantity is normal for a lighting section of a liquid crystal display.

If the display lighting section 16 is used, light is passed through the thin film of tantalum 25 having the film thickness of 25 nm which is the first electrode and light of 5000 lux can be emitted to the M-I interface of the nonlinear resistance element 14a formed by using the side wall and top of the first electrode 22.

Figure 14:
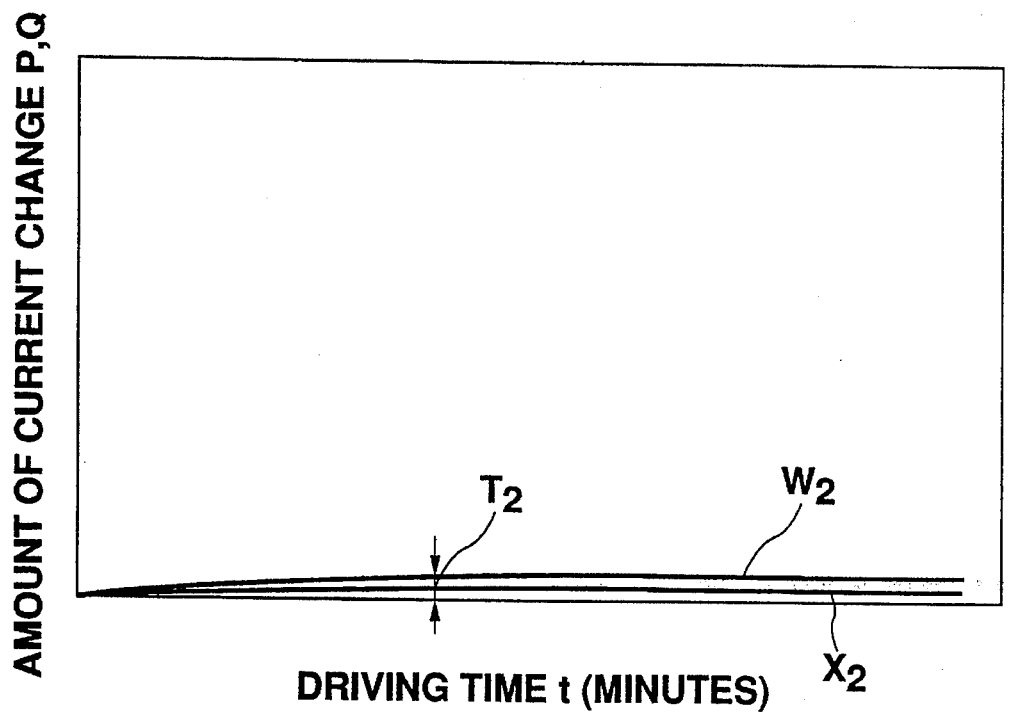
FIG. 14 is a Graph showing the relationships between change amounts of current values according to the voltage polarity and the driving time of a nonlinear resistance element of the liquid crystal display according to the third embodiment of the invention when light is emitted to the nonlinear resistance element.

FIG. 14 is a graph showing the relationship between the driving time (t) and change amounts of current (P and Q) when the nonlinear resistance element 14a in the embodiment shown in FIG. 13 is driven while light is being emitted-thereto by using the display lighting section 16 having the light quantity of 20000 lux.

The curve W2 shown in FIG. 14 denotes the dependency of the change amount of current (P2) indicating the difference between the initial characteristic when a positive voltage is applied to the first electrode (Ta) 22 in FIG. 13 and the characteristic after it is driven, on the driving time (t). In contrast, the curve X2 denotes the dependency of the change amount of current (Q2) indicating the difference between the initial characteristic when a negative voltage is applied to the first electrode (Ta) 22 and the characteristic after it is driven, on the driving time (t).

As shown in the graph of FIG. 14, the curve W2 indicating the state in which a positive voltage is applied to the first electrode 22 means that the change amount of current increases only a little with an increase in the driving time; the curve X2 indicating the state in which a negative voltage is applied to the first electrode 22 means that the change amount of current is extremely small as the driving time increases.

The difference between the curves W2 and X2, T2, remains substantially unchanged although the driving time is increased.

As described above, the third embodiment, like the second embodiment, can make a change in the element characteristics small by emitting light to the nonlinear resistance element 14a.

Further, the asymmetrical nonlinear resistance element characteristic change made according to the polarity of driving voltage in the current-voltage characteristic can be made small. Thus, a display quality change made by driving the liquid crystal display and a flicker phenomenon and an image burn phenomenon caused by applying a DC voltage to the liquid crystal can be reduced.

Figure 15:
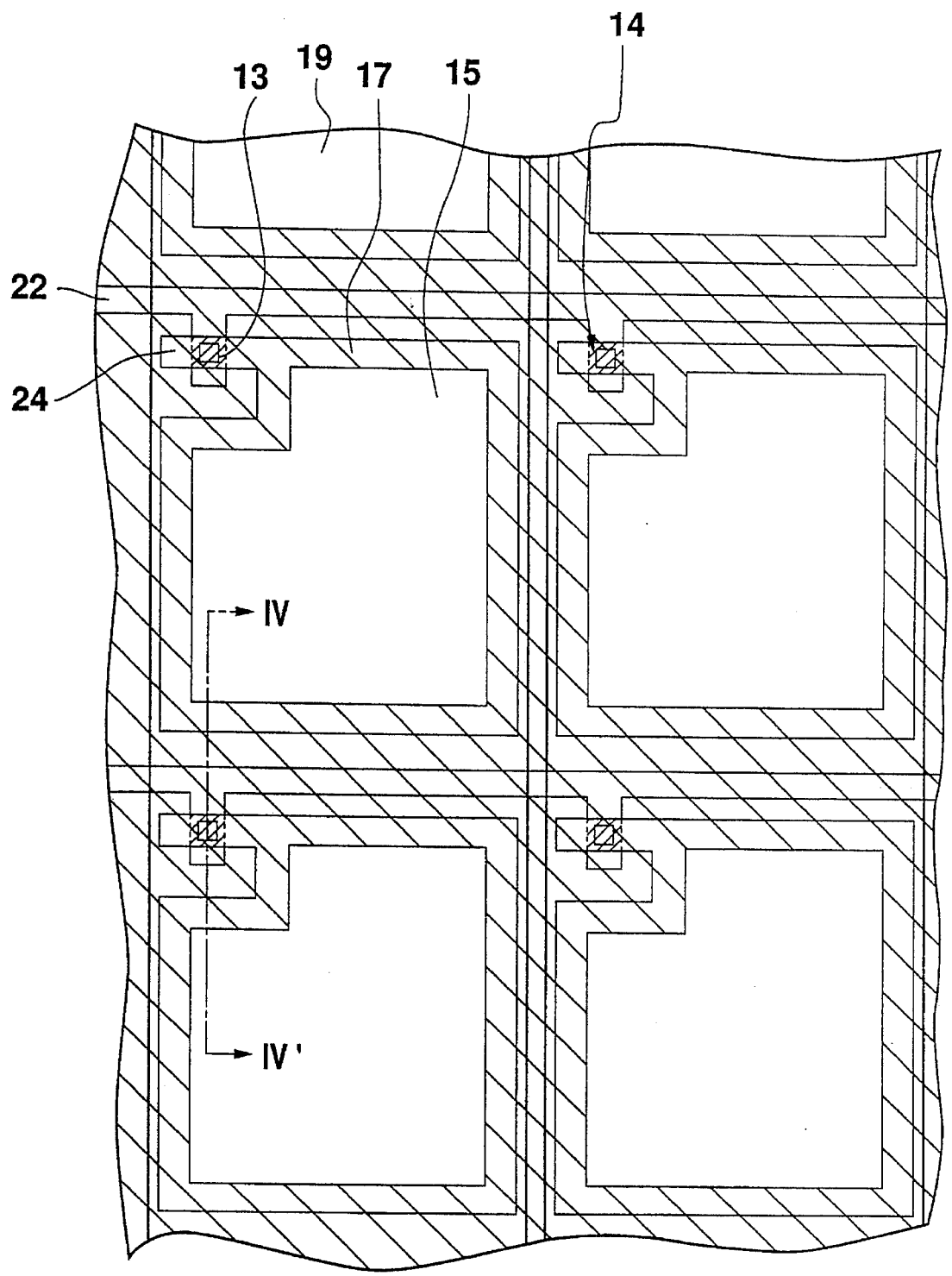
FIG. 15 is a plan view showing a liquid crystal display according to a fourth embodiment of the invention
Figure 16:
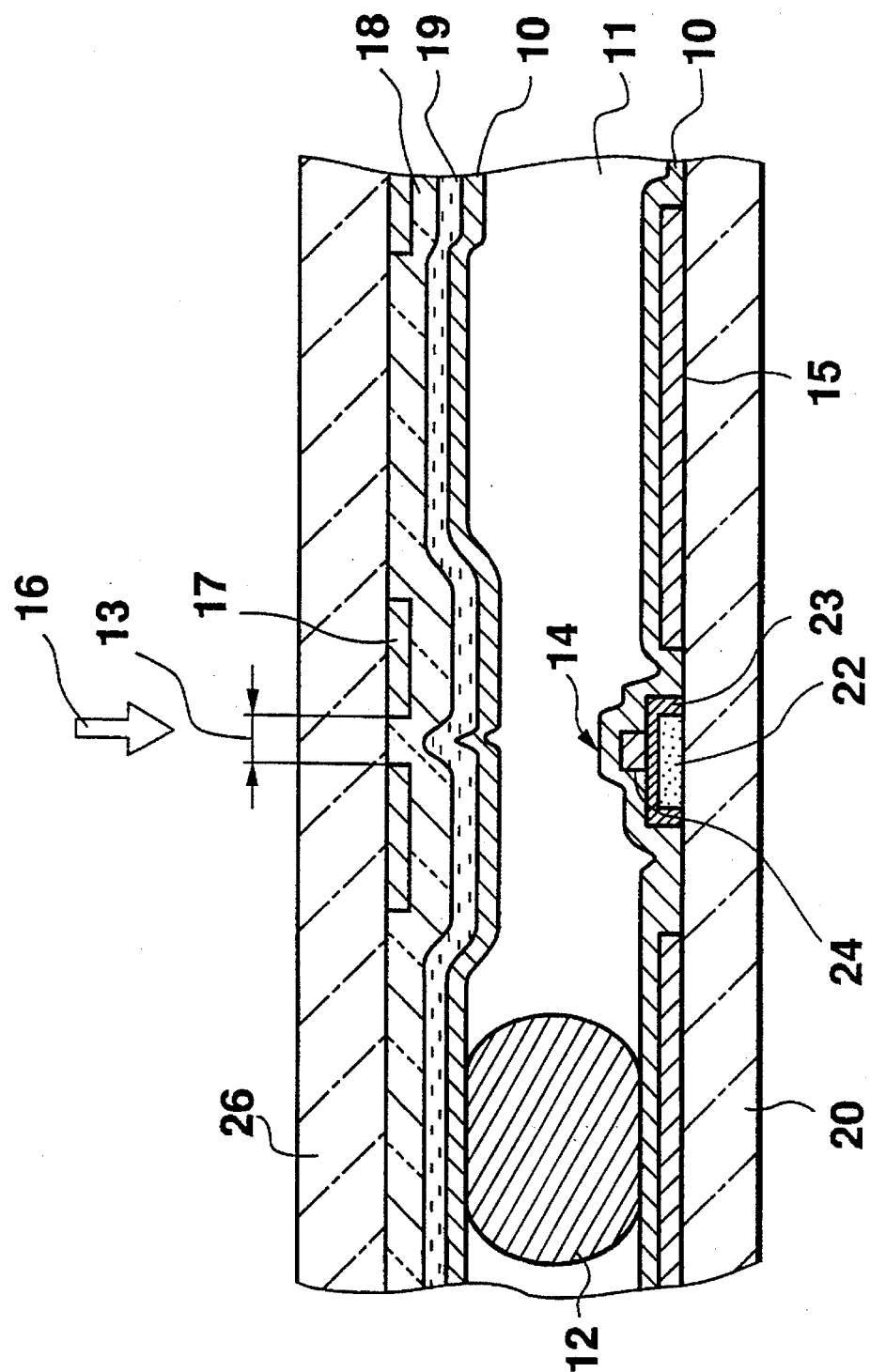
FIG. 16 is a sectional view taken on line IV–IV' of FIG. 15.

Fourth embodiment:

Next, a liquid crystal display according to a fourth embodiment of the invention will be described. FIG. 15 is a plan view showing the liquid crystal display according to the fourth embodiment of the invention. FIG. 16 is a sectional view taken on line IV-IV' of FIG. 15. Members identical with or similar to those previously described with reference to FIG. 8 and 9 are denoted by the same reference numerals in FIGS. 15 and 16.

As shown in FIG. 16, a first electrode 22 made of tantalum (Ta) having the film thickness of 150 nm is formed on a first substrate 20, and a nonlinear resistance layer 23 made of tantalum oxide ($Ta_2O_5$) having the film thickness of 65 nm formed by performing an anodic oxidation treatment of the first electrode 22 is formed on the first electrode 22. The film thickness 150 nm of the first electrode 22 changes to 115 nm after the anodic oxidation treatment.

Further, a second electrode 24 made of ITO (indium tin oxide) as a transparent conducting film is formed on the nonlinear resistance layer 23.

The portion in which the first and second electrodes 22 and 24 are opposite to each other via the nonlinear resistance layer 23 forms a nonlinear resistance element 14 of a MIM structure.

As shown in the plan view of FIG. 15, a partial area of the second electrode 24 also serves as a display electrode 15.

Further, on a second substrate 26, an opposite electrode 19 made of a transparent conducting film of ITO, etc., is disposed so as to be opposite to the display electrode 15 on the first substrate.

As shown in FIG. 15, the first electrode 22 and the display electrode 15 have a given clearance between them so as not to short circuit them.

The display electrode 15 and the opposite electrode 19 are positioned on opposite sides so as to overlap each other, thereby making up a picture element part of a liquid crystal display panel.

The liquid crystal display performs predetermined image display in response to a transmittance change of liquid crystal of the picture element part.

The first and second substrates 20 and 26 are each formed with an orientation film 40 as a processing layer to regularly arrange molecules of liquid crystal 11. Further, a spacer 12 is provided to make the first and second substrates 20 and 26 opposite to each other at a predetermined interval, and liquid crystal 11 is enclosed between the first and second substrates 20 and 26.

In the fourth embodiment of the invention described in conjunction with FIGS. 15 and 16, a black matrix 17 shown hatched in FIG. 15 is provided with an aperture 13 for emitting light to the nonlinear resistance element 14, and the area of the aperture 13 is made smaller than that of the nonlinear resistance element 14.

Anodic oxidation is executed by using a metal film made of tantalum having the film thickness of 150 nm as the first electrode 22, a component of the nonlinear resistance element 14. After the anodic oxidation treatment, tantalum having the film thickness of 115 nm remains as the first electrode 22. Thus, as shown in FIG. 12, the light transmittance of the first electrode 22 can be made sufficiently small, and light leakage from the black matrix 17 can be prevented completely. The display quality of the liquid crystal display does not degrade.

The liquid crystal display, which does not emit light by itself, requires a display lighting section 16 as external light.

Light emission means for emitting light to the nonlinear resistance element 14 is described. The display lighting section 16 which consists of, for example, a 3-band fluorescent lamp, a reflection board, and a diffusion board is disposed on the side of the second substrate 26. Light from the display lighting section 16 is passed through the aperture 13 of the black matrix 17 formed on the second substrate 26.

Such light emission means can be used to easily emit light particularly to the M-I interface of the nonlinear resistance element 14.

With the liquid crystal display according to the fourth embodiment of the invention described in conjunction with FIGS. 15 and 16, light can also be easily emitted to the nonlinear resistance element 14, and asymmetrical change amounts according to the polarity of voltage applied to the first electrode 22 can be extremely small. As a result, application of a DC voltage to the liquid crystal can be reduced, thereby preventing the quality of the liquid crystal and contrast from degrading and flicker and image burn phenomena from occurring. Therefore, the liquid crystal display having a good image quality can be provided.

Figure 17:
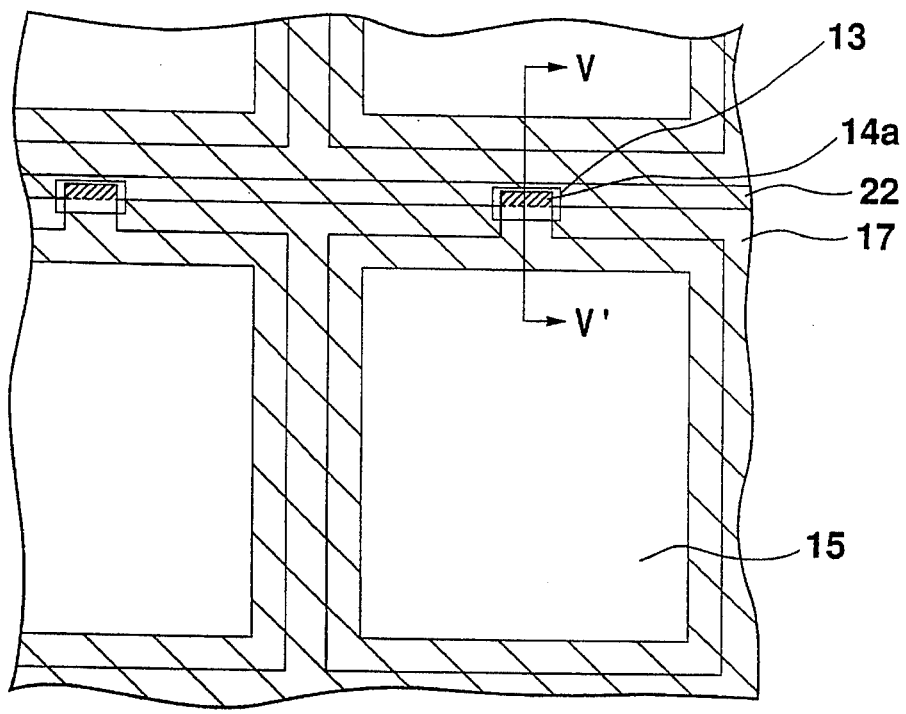
FIG. 17 is a plan view showing a liquid crystal display according to a fifth embodiment of the invention.
Figure 18:
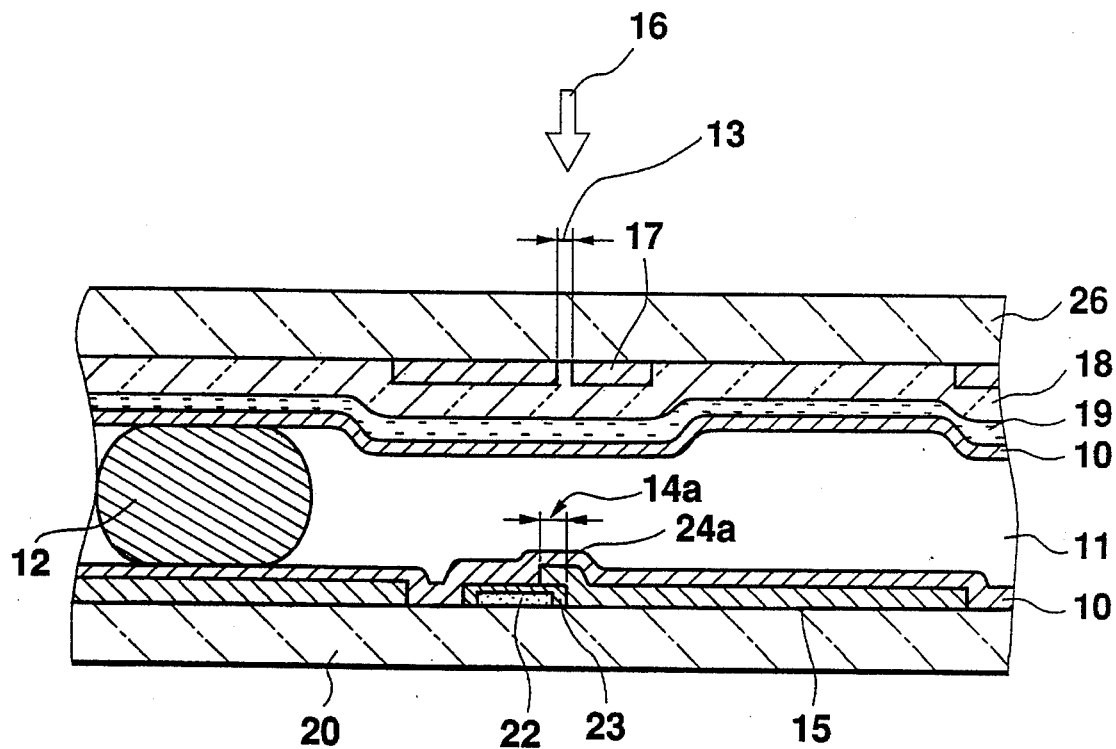
FIG. 18 is a sectional view taken on line V–V' of FIG. 17.

Fifth embodiment:

Next, a liquid crystal display according to a fifth embodiment of the invention will be described. FIG. 17 is a plan view showing the liquid crystal display according to the fifth embodiment of the invention. FIG. 18 is a sectional view taken on line V–V' of FIG. 17. Members identical with or similar to those previously described with reference to FIG. 16 are denoted by the same reference numerals in FIGS. 17 and 18.

As shown in FIG. 18, a first electrode 22 made of tantalum (Ta) having the film thickness of 150 nm is formed on a first substrate 20, and a nonlinear resistance layer 23 made of tantalum oxide ($Ta_2O_5$) having the film thickness of 65 nm provided by performing an anodic oxidation treatment of the first electrode 22 is formed on the first electrode 22. The film thickness of 150 nm of the first electrode 22 changes to 115 nm after the anodic oxidation treatment.

Further, a second electrode 24a made of ITO (indium tin oxide) as a transparent conducting film is formed on the nonlinear resistance layer 23.

The side wall area of the first electrode 22 where the second electrode 24a is formed and the top area of the first electrode 22 where the second electrode 24a slightly overlaps the first electrode 22 form a nonlinear resistance element 14a.

As shown in the plan view of FIG. 17, a partial area of the second electrode 24a also serves as a display electrode 15.

Further, on a second substrate 26, an opposite electrode 19 made of an ITO film, a transparent conducting film is disposed so as to be opposite to the display electrode 15.

As shown in FIG. 17, the first electrode 22 and the display electrode 15 have a given clearance between them so as not to short circuit them.

The display electrode 15 and the opposite electrode 19 are positioned on opposite sides so as to overlap each other, thereby making up a picture element part of a liquid crystal display panel.

The liquid crystal display performs predetermined display in response to a transmittance change of the liquid crystal of the picture element part.

The first and second substrates 20 and 26 are each formed with an orientation film 40 as a processing layer to regularly arrange molecules of liquid crystal 11. Further, a spacer 12 is provided to make the first and second substrates 20 and 26 opposite to each other at a predetermined interval, and liquid crystal 11 is enclosed between the first and second substrates 20 and 26.

In the fifth embodiment of the invention described in conjunction with FIGS. 17 and 18, a black matrix 17 shown hatched in FIG. 17 is provided with an aperture 13 for emitting light to the nonlinear resistance element 14a, and the area of the aperture 13 is made smaller than that of the nonlinear resistance element 14a.

Anodic oxidation is executed by using a metal film made of tantalum having the film thickness of 150 nm as the first electrode 22, a component of the nonlinear resistance element 14a. After the anodic oxidation treatment, tantalum having the film thickness of 115 nm remains as the first electrode 22. Thus, as shown in FIG. 12, the light transmittance of the first electrode 22 can be made sufficiently small, and light leakage from the black matrix 17 can be prevented completely. The display quality of the liquid crystal display does not degrade.

The liquid crystal display, which does not emit light by itself, requires a display lighting section 16 as external light.

Light emission means for emitting light to the nonlinear resistance element 14a will be described. The display lighting section 16 which consists of, for example, a 3-band fluorescent lamp, a reflection board, and a diffusion board is disposed on the side of the second substrate 26. Light from the display lighting section 16 is passed through the aperture 13 of the black matrix 17 formed on the second substrate 26.

Such light emission means can be used to easily emit light particularly to the M-I interface of the nonlinear resistance element 14a.

With the liquid crystal display according to the fourth embodiment of the invention described in conjunction with FIGS. 17 and 18, light can also be easily emitted to the nonlinear resistance element 14a, and asymmetrical change amounts according to the polarity of voltage applied to the first electrode 22 can be extremely small. As a result, application of a DC voltage to the liquid crystal can be reduced, thereby preventing the quality of the liquid crystal and contrast from degrading and flicker and image burn phenomena from occurring. Therefore, the liquid crystal display having a good image quality can be provided.

Figure 19:
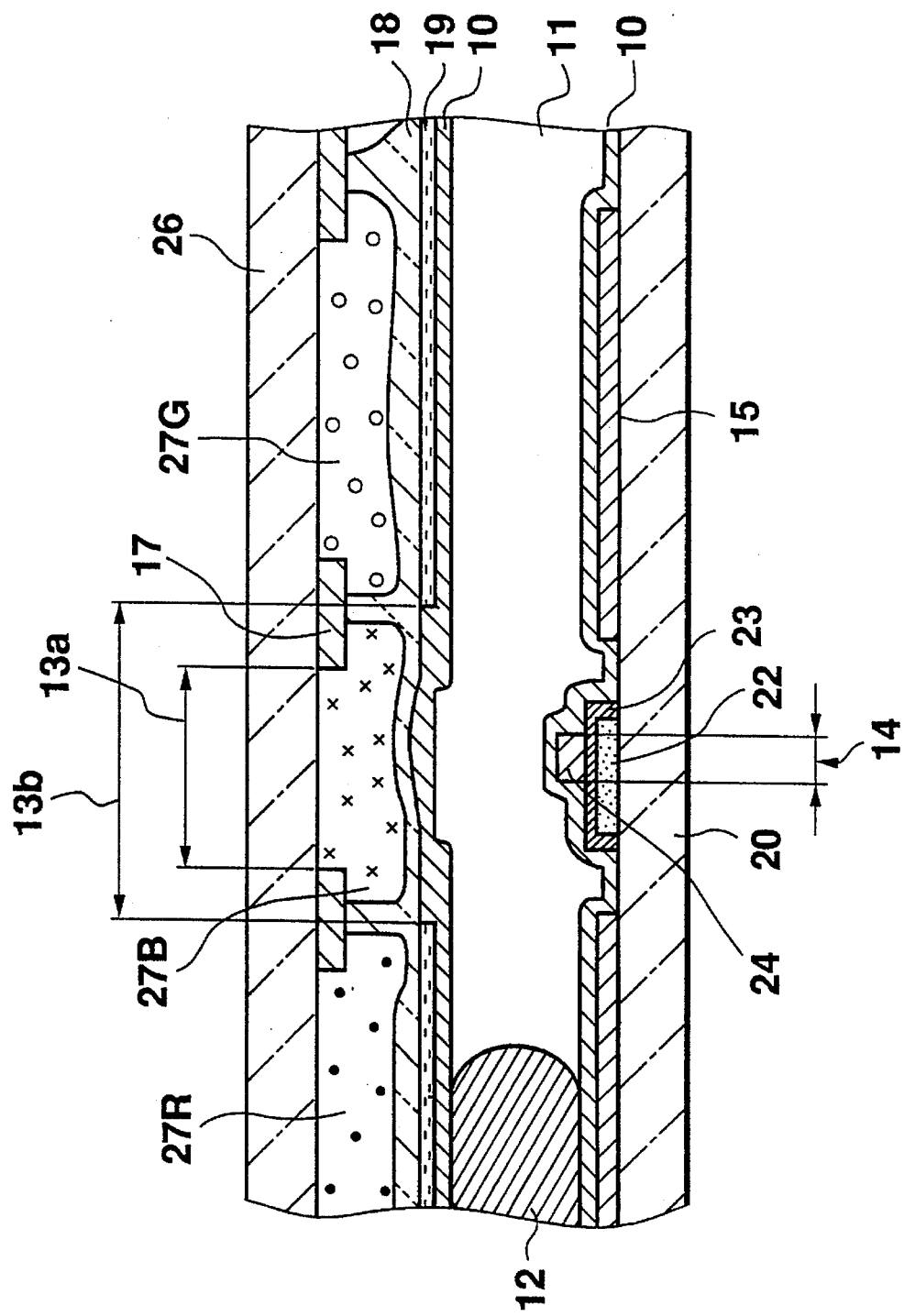
FIG. 19 is a sectional view showing a liquid crystal display according to a sixth embodiment of the invention.

Sixth embodiment:

Next, a liquid crystal display according to a sixth embodiment of the invention will be described. FIG. 19 is a sectional view showing the liquid crystal display according to the sixth embodiment of the invention.

When the area of a nonlinear resistance element 14 is made small by microminiaturization and the precision of overlap of a first substrate 20 and a second substrate 26 becomes greater than the size of the nonlinear resistance element 14, an aperture for emitting light to the nonlinear resistance element 14 formed in a black matrix 17 and the nonlinear resistance element 14 are placed out of position, making it impossible to efficiently emit light to the nonlinear resistance element 14.

When the out-of-position trouble occurs, it is necessary to make the area of the aperture 13a formed in the black matrix 17 larger than the area of the nonlinear resistance element 14, as shown in FIG. 19.

However, if the area of the aperture 13a formed in the black matrix 17 is made larger, the nonlinear resistance element 14 becomes incapable of shielding the aperture 13a and light leaks from the aperture 13a, degrading the display quality of the liquid crystal display.

Thus, in the sixth embodiment of the invention described with FIG. 19, the aperture 13a for emitting light to the nonlinear resistance element 14 is provided with a color filter 27.

If the color filters 27 with which the apertures 13a are provided differ in absorption characteristic (spectral distribution), such as red, blue, or green, the energy amounts of light emitted to the nonlinear resistance elements 14 vary. Thus, the change amounts of the current-voltage characteristics when the nonlinear resistance elements 14 are driven vary and display becomes uneven, degrading the display quality.

Then, the liquid crystal display according to the sixth embodiment uses color filters which match, in absorption characteristics, the color filters 27 with which the apertures 13a are provided.

The characteristic change when the nonlinear resistance element 14 is driven can be suppressed sufficiently low by emitting light whose wavelength is 450 nm to 5400 nm (short wavelength of visible light region) to the nonlinear resistance element 14.

Preferably, the aperture 13a is provided with a blue color filter having the worst luminous efficacy characteristic to prevent the display quality of the liquid crystal display from degrading when light leaks from the aperture 13a. However, even if other color filters such as red or green are used, the effect can be provided if the color filters 27 corresponding to the nonlinear resistance elements 14 are of the same color.

Further, to prevent an opposite electrode 19 from absorbing light leaked from the aperture 13a, the opposite electrode 19 on the nonlinear resistance element 14 is provided with an aperture 13b having an aperture area larger than the aperture 13a.

The specific configuration of the embodiment will be described.

As shown in FIG. 19, a first electrode 22 made of a tantalum film is formed on a first substrate 20.

Further, a nonlinear resistance layer 23 made of tantalum oxide formed by performing an anodic oxidation treatment of the tantalum of the first electrode 22 is formed on the first electrode 22.

Further, as a second electrode 24, a transparent conducting film made of an ITO film is formed so as to overlap the nonlinear resistance layer 23, forming a nonlinear resistance element 14 of a MIN structure.

A partial area of the second electrode 24 also serves as a display electrode 15.

A black matrix 17 is formed on a second substrate 26 to prevent light from leaking from gaps in display electrodes 15 formed on the first substrate 20.

An aperture 13a for emitting light to the nonlinear resistance element 14 is formed in the black matrix 17.

The size of the aperture 13a is made larger than the nonlinear resistance element 14.

On the black matrix 17, color filters 27 are formed so as to be opposite to the display electrode 15.

To provide the liquid crystal display with the full color display function, the color filters 27 of red 27R, green 27G, and blue 27B are formed opposite the display electrode 15.

Further, a blue color filter 27B is formed on the aperture 13a of the black matrix 17.

An opposite electrode 19 made of an ITO film is formed on the color filters 27 formed opposite to the display electrode 15. The opposite electrode 19 made of a transparent conducting film of ITO, etc., is formed on the color filters 27 via an insulating film 18 so as not to be in contact with the black matrix 17.

In the opposite electrode 19 formed in the second substrate 26, an aperture area 13b is formed so as to be opposite to the formation area of the nonlinear resistance element 14.

Further, the first electrode 22 and the display electrode 15 are spaced at a given clearance so as not to be in contact with each other.

The display electrode 15 and the opposite electrode 19 are disposed on opposite sides so as to overlap each other, thereby making up a picture element part of a liquid crystal display panel.

The black matrix 17 is formed so as to project to the formation area of the display electrode 15 for the purpose of preventing light from leaking from the peripheral area of the display electrode 15.

The liquid crystal display performs predetermined display in response to a transmittance change of liquid crystal 11 in an area in which the black matrix 17 on the display electrode 15 is not formed.

The first and second substrates 20 and 26 are each formed with an orientation film 10 as a processing layer to regularly arrange molecules of liquid crystal 11. Further, a spacer 12 is provided to make the first and second substrates 20 and 26 opposite to each other at a predetermined interval, and liquid crystal 11 is enclosed between the first and second substrates 20 and 26.

As can be seen in FIG. 19, the area of the aperture 13a formed in the black matrix 17 is made larger than the area of the nonlinear resistance element 14, and further a blue color filter 27B is formed in the aperture 13a for emitting light to the nonlinear resistance element 14, thereby emitting light efficiently to the nonlinear resistance element 14.

At the same time, light leakage from between the black matrix 17 and the nonlinear resistance element 14 can be attenuated through the color filters 17 for preventing the display quality of the liquid crystal display from degrading.

Degradation of the display quality of the liquid crystal display can be further suppressed by selecting the absorption characteristic of the color filter formed in the area of the aperture 13a for emitting light to the nonlinear resistance element 14.

Figure 20:
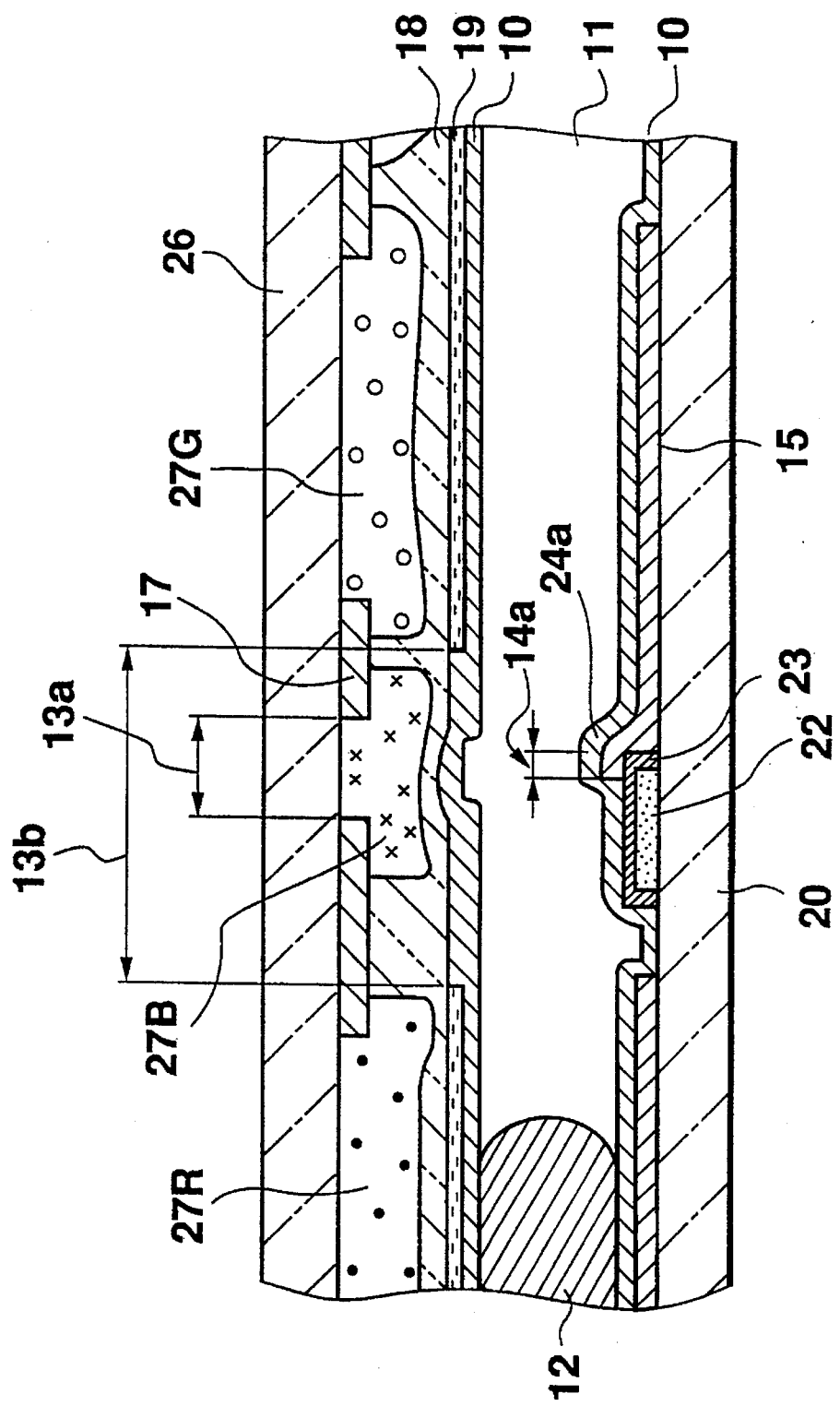
FIG. 20 is a sectional view showing a liquid crystal display according to a seventh embodiment of the invention.

Seventh embodiment:

Next, a liquid crystal display according to a seventh embodiment of the invention will be described. FIG. 20 is a sectional view showing the liquid crystal display according to the seventh embodiment of the invention. Members identical with or similar to those previously described with reference to FIG. 19 are denoted by the same reference numerals in FIG. 20.

When the area of a nonlinear resistance element 14a is made small by microminiaturization and the precision of overlap of a first substrate 20 and a second substrate 26 becomes greater than the size of the nonlinear resistance element 14a, an aperture 13a formed in a black matrix 17 for emitting light to the nonlinear resistance element 14a and the nonlinear resistance element 14a are placed out of position, making it impossible to efficiently emit light to the nonlinear resistance element 14a.

When the out-of-position trouble occurs, it is necessary to make the area of the aperture 13a formed in the black matrix 17 larger than the area of the nonlinear resistance element 14a.

However, if the area of the aperture 13a formed in the black matrix 17 is made larger, the nonlinear resistance element 14a becomes incapable of shielding the aperture 13a and light leaks from the aperture 13a, degrading the display quality of the liquid crystal display.

Thus, in the seventh embodiment of the invention described with FIG. 20, the aperture 13a for emitting light to the nonlinear resistance element 14a is provided with a color filter 27.

If the color filters 27 with which the apertures 13a are provided differ in absorption characteristics (spectral distribution), such as red, blue, or green, the amounts of light energy emitted to the nonlinear resistance elements 14a vary. Thus, the change amounts of the current-voltage characteristics when the nonlinear resistance elements 14a are driven vary and the display becomes uneven, degrading the display quality.

Then, the liquid crystal display according to the seventh embodiment uses color filters which match the absorption characteristics of the color filters 27 with which the apertures 13a are provided.

The characteristic change when the nonlinear resistance element 14a is driven can be suppressed sufficiently low by emitting light whose wavelength is 450 nm to 5400 nm (short wavelength of visible light region) to the nonlinear resistance element 14a.

The aperture 13a is provided with a blue color filter having the worst luminous efficacy characteristic to prevent the display quality of the liquid crystal display from degrading when light leaks from the aperture 13a. However, even if other color filters such as red or green are used, the effect can be provided if the color filters 27 corresponding to the nonlinear resistance elements 14a are of the same color.

Further, to prevent an opposite electrode 19 from absorbing light leaked from the aperture 13a, the opposite electrode 19 on the nonlinear resistance element 14a is provided with an aperture 13b having an aperture area larger than the aperture 13a.

The specific configuration of the embodiment will be described.

As shown in FIG. 20, a first electrode 22 made of a tantalum film is formed on a first substrate 20.

Further, a nonlinear resistance layer 23 made of tantalum oxide formed by performing an anodic oxidation treatment of tantalum of the first electrode 22 is formed on the first electrode 22.

Further, as a second electrode 24a, a transparent conducting film made of an ITO film is formed on the nonlinear resistance layer 23. The second electrode 24a is formed so as to overlap the side wall area of the first electrode 22 and a small area on the top of the first electrode 22, and the portion in which the first and second electrodes 22 and 24a are opposite to each other via the nonlinear resistance layer 23 forms a nonlinear resistance element 14a.

A partial area of the second electrode 24a also serves as a display electrode 15.

A black matrix 17 is formed on a second substrate 26 to prevent light from leaking from gaps in display electrodes 15 formed on the first substrate 20.

An aperture 13a for emitting light to the nonlinear resistance element 14a is formed in the black matrix 17.

The size of the aperture 13a is made larger than the nonlinear resistance element 14a.

On the black matrix 17, color filters 27 are formed so as to be positioned opposite to the display electrode 15.

To provide the liquid crystal display with the full color display function, the color filters 27 of red 27R, green 27G, and blue 27B are formed opposite to the display electrode 15.

Further, a blue color filter 27B is formed on the aperture 13a of the black matrix 17.

An opposite electrode 19 made of an ITO film is formed on the color filters 27 formed opposite to the display electrode 15. The opposite electrode 19 is formed on the color filters 27 via an insulating film 18 so as not to be in contact with the black matrix 17.

In the opposite electrode 19 formed in the second substrate 26, an aperture area 13b is formed so as to be opposite to the formation area of the nonlinear resistance element 14a.

Further, the first electrode 22 and the display electrode 15 are spaced at a given clearance so as not to be in contact with each other.

The display electrode 15 and the opposite electrode 19 are disposed so as to overlap each other, thereby making up a picture element part of a liquid crystal display panel.

The black matrix 17 is formed so as to project into the formation area of the display electrode 15 for preventing light from leaking from the peripheral area of the display electrode 15.

The liquid crystal display performs predetermined display in response to a transmittance change of liquid crystal 11 in an area in which the black matrix 17 on the display electrode 15 is not formed.

The first and second substrates 20 and 26 are each formed with an orientation film 10 as a processing layer to regularly arrange molecules of liquid crystal 11. Further, a spacer 12 is provided to make the first and second substrates 20 and 26 opposite to each other at a predetermined interval, and liquid crystal 11 is enclosed between the first and second substrates 20 and 26.

As can be seen in FIG. 20, the area of the aperture 13a formed in the black matrix 17 is made larger than the area of the nonlinear resistance element 14a and further a blue color filter 27B is formed in the aperture 13a for emitting light to the nonlinear resistance element 14a, thereby emitting light efficiently to the nonlinear resistance element 14a.

At the same time, light leakage from between the black matrix 17 and the nonlinear resistance element 14a can be attenuated through the color filters 17 to prevent the display quality of the liquid crystal display from degrading.

Degradation of the display quality of the liquid crystal display can be furthermore suppressed by selecting the absorption characteristic of the color filter formed in the area of the aperture 13a for emitting light to the nonlinear resistance element 14a.

Figure 21:
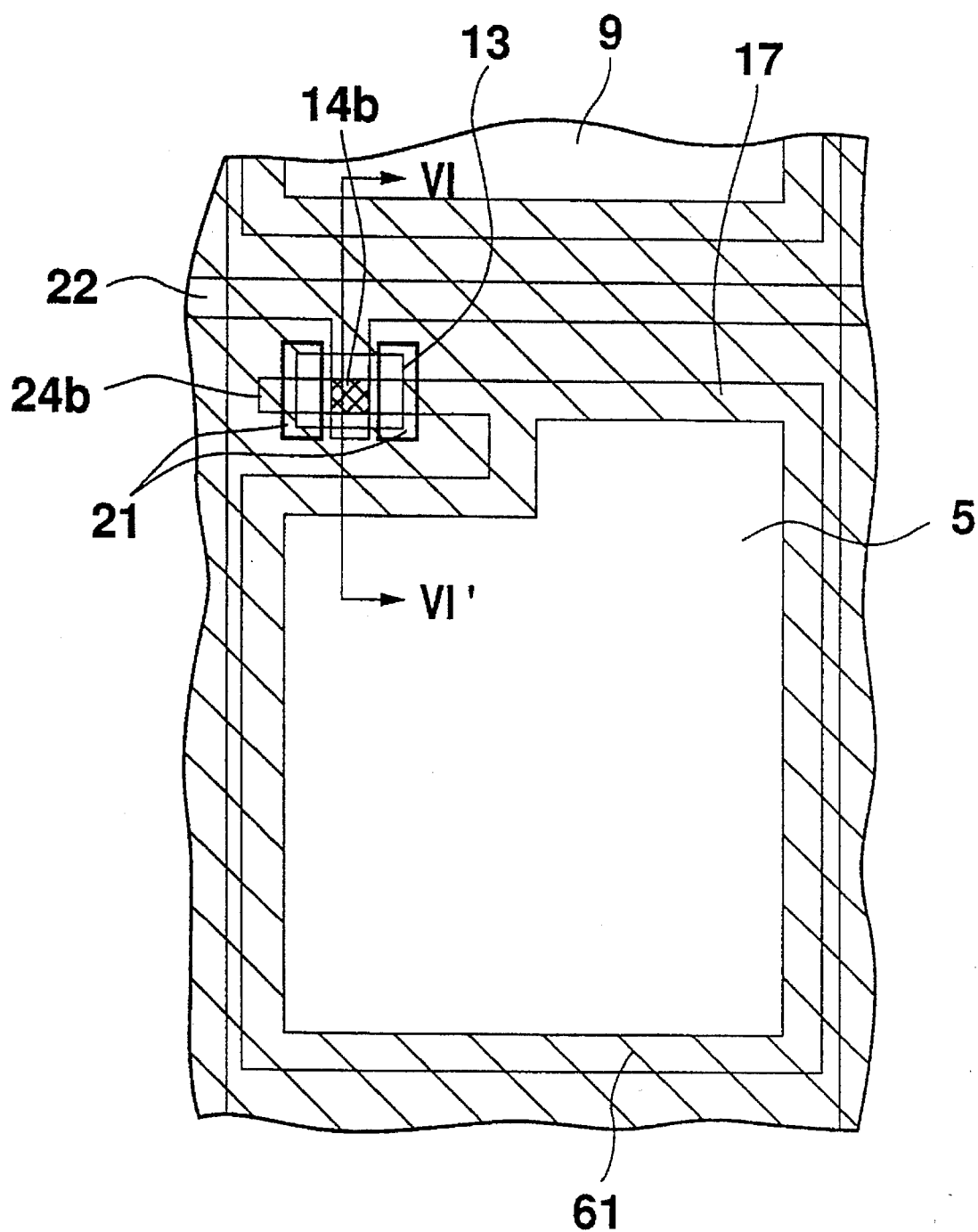
FIG. 21 is a plan view showing a liquid crystal display according to an eighth embodiment of the invention.
Figure 22:
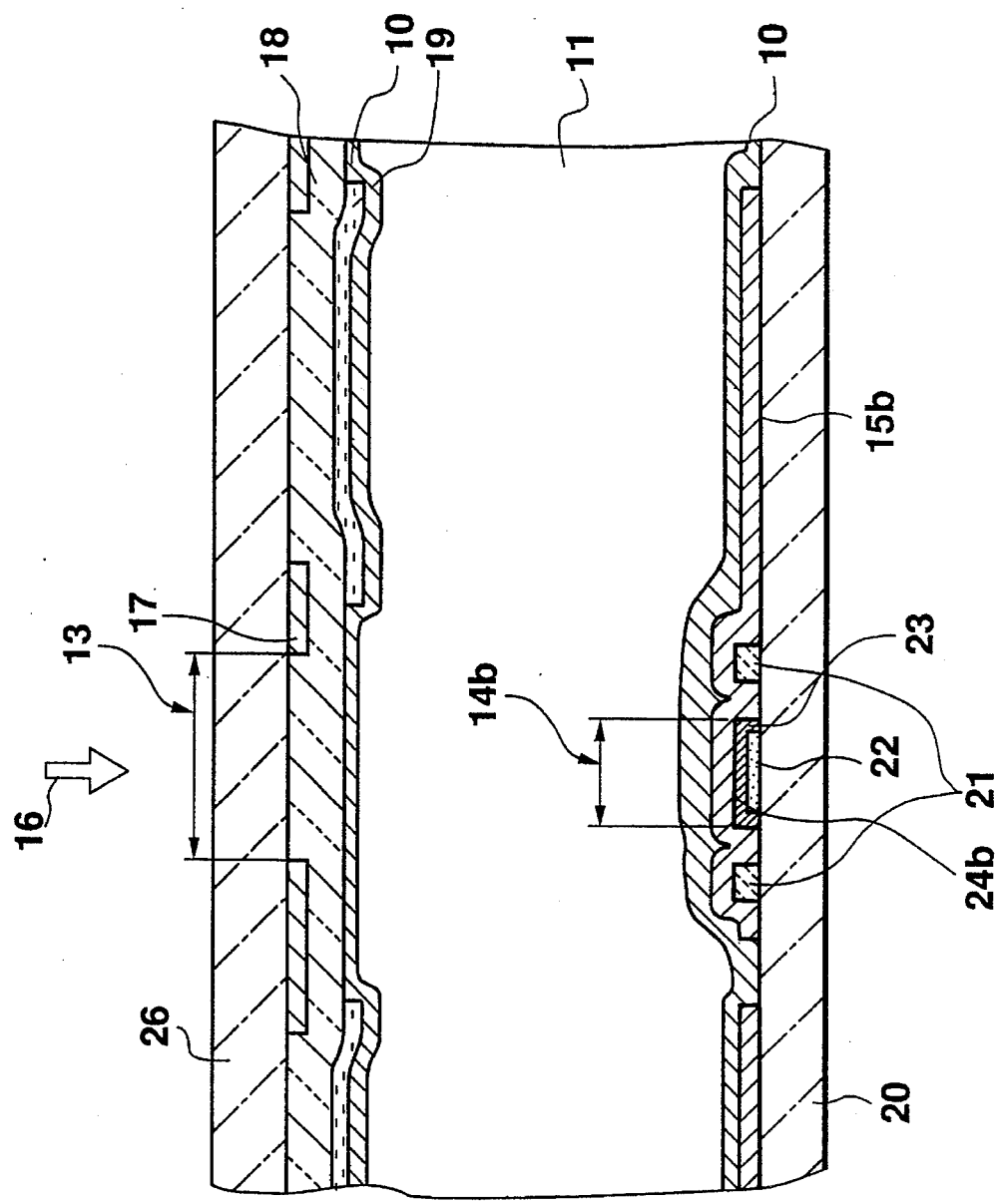
FIG. 22 is a sectional view taken on line VI–VI' of FIG. 21.

Eighth embodiment:

Next, a liquid crystal display according to an eighth embodiment of the invention will be described. FIG. 21 is a plan view showing the liquid crystal display according to the eighth embodiment of the invention. FIG. 22 is a sectional view taken on line VI–VI' of FIG. 21.

In the embodiment shown in FIG. 21, shielding parts 21 made of the material of a first or second electrode 22 or 24b are formed at the periphery of a nonlinear resistance element 14b in order to prevent light from leaking from an aperture 13 formed in a black matrix 17, shown hatched with lines 61 in FIG. 21, for emitting light to the nonlinear resistance element 14b.

Thus, because the shielding parts 21 can prevent light from leaking from the aperture 13 of the black matrix 17 without increasing the number of steps, the display quality of the liquid crystal display can be improved.

Next, the eighth embodiment will be described more specifically in conjunction with FIG. 22.

A first electrode 22 made of a tantalum (Ta) film is formed on a first substrate 20.

A nonlinear resistance layer 23 made of tantalum oxide formed by performing an anodic oxidation treatment of the tantalum of the first electrode 22 is formed on the first electrode 22.

Further, as a second electrode 24, a lamination film of a chromium (Cr) film and a transparent conducting film made of an ITO film is formed so as to overlap the nonlinear resistance layer 23. The portion in which the first and second electrodes 22 and 24b are opposite to each other via the nonlinear resistance layer 23 forms a nonlinear resistance element 14b of a MIM structure.

Shielding parts 21 made of tantalum, which is the material of the first electrode 2, are formed at the periphery of the nonlinear resistance element 14b so as to be placed apart from the nonlinear resistance element 14b at a distance of about 1 µm.

A partial area of the second electrode 24a also serves as a display electrode 15.

The chromium film used as the second electrode 24b is 10 nm to 30 nm thick. If it is used as a display electrode 15b, the transmittance lowers 10% to 20% or so and no problem arises in practical use.

On the other hand, a black matrix 17 is formed on a second substrate 26 to prevent light from leaking from gaps between display electrodes 15b formed on the first substrate 20.

The black matrix 17 has an aperture 13a for emitting light to the nonlinear resistance element 14b from a display lighting section 16 disposed on the side of the second substrate 26.

An opposite electrode 19, made of an ITO film, is formed on the second substrate 26 so as to be opposite to the display electrode 15. The opposite electrode 19 is formed on the second substrate 26 via an insulating film 18 so as not to be in contact with the black matrix 17. Numeral 10 in FIG. 22 denotes an orientation film to orient liquid crystal 11 in a predetermine direction.

As described above, the shielding parts 21 made of the material of the first or second electrode 22 or 24b are formed at the periphery of the nonlinear resistance element 14b in order to prevent light from leaking from the aperture 13 formed in a black matrix 17 for emitting light to the nonlinear resistance element 14b.

Thus, the shielding parts 21 can completely prevent light from leaking from the aperture 13 formed in the black matrix 17 without increasing the number of steps.

As a result, light can be efficiently emitted to the nonlinear resistance element 14b without degrading the display quality of the liquid crystal display. Thus, a change in the nonlinear resistance element characteristics can be made small.

Further, since the asymmetrical nonlinear resistance element characteristic change made according to the polarity of driving voltage can be made small, a display quality change made by driving the liquid crystal display or a flicker phenomenon and an image burn phenomenon caused by applying a DC voltage to the liquid crystal can be reduced.

Figure 23:
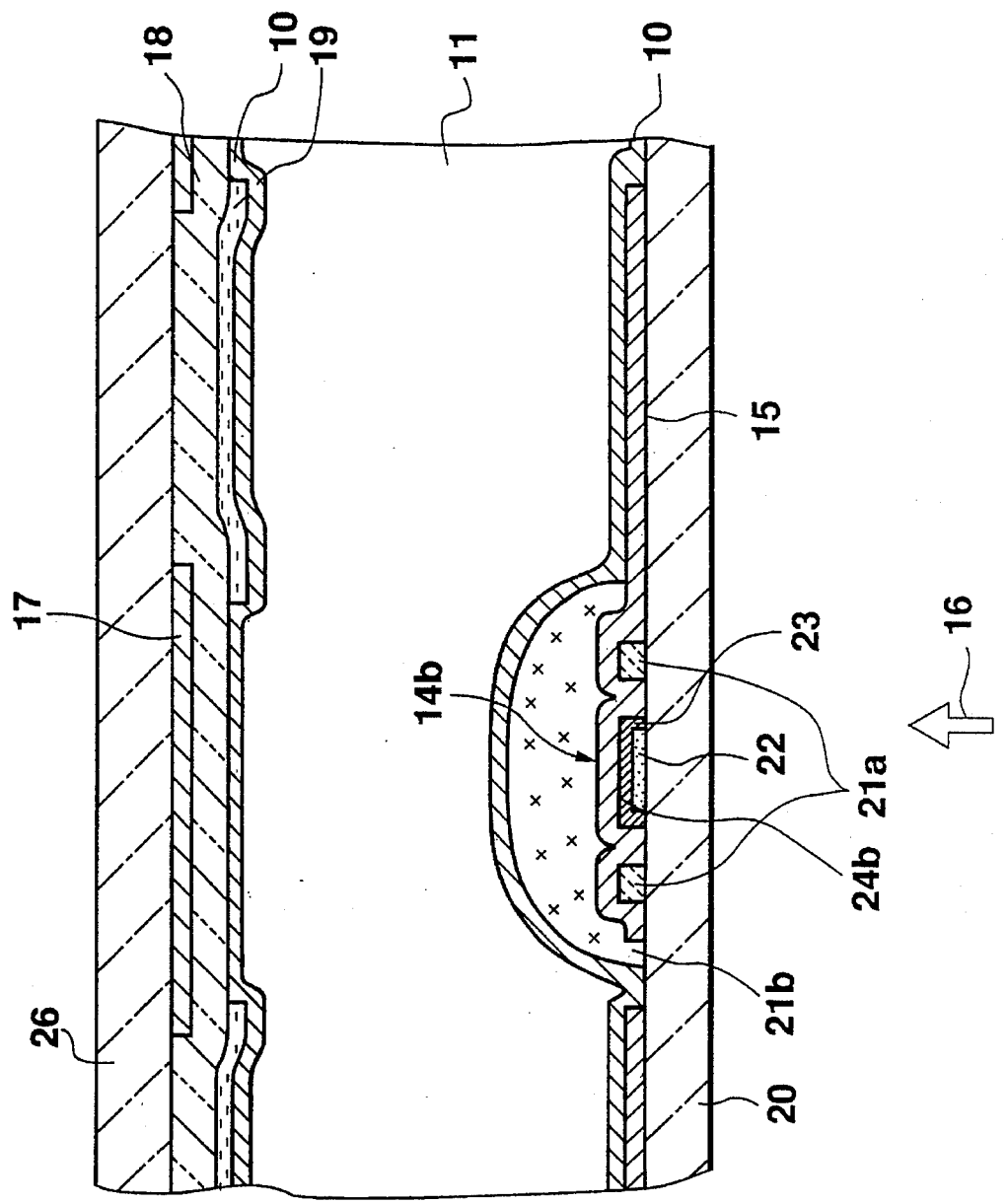
FIG. 23 is a sectional view showing a liquid crystal display according to a ninth embodiment of the invention.

Ninth embodiment:

Next, a liquid crystal display according to a ninth embodiment of the invention will be described. FIG. 23 is a sectional view showing the liquid crystal display according to the ninth embodiment of the invention.

The embodiment is applied when a first electrode 22 and a second electrode 24b making up a nonlinear resistance element 14b transmit light of only 10% or less.

In the embodiment, to efficiently emit light from a display lighting section 16 disposed on the side of a first substrate 20, light reflection parts 21a made of the material of the first electrode 22 need to be formed at the periphery of the nonlinear resistance element 14b for focusing light on the nonlinear resistance element 14b.

To guide much more light to the nonlinear resistance element 14b, preferably, polyimide transmitting light to the periphery of the nonlinear resistance element 14b is dropped with a dispenser, thereby forming a dome-like pattern 21b by using surface tension of the polyimide. Light from the display lighting section 16 is refracted by means of the dome-like pattern 21b and focused on the formation area of the nonlinear resistance element 14b.

Although both the light reflection parts 21a and the dome-like pattern 21b made of polyimide are formed at the periphery of the nonlinear resistance element 14b in the embodiment shown in FIG. 23, sufficient light can be emitted to the nonlinear resistance element 14b by forming only the light reflection parts 21a without forming the dome-like pattern 21b at the periphery of the nonlinear resistance element 14b.

Also, sufficient light can be emitted to the nonlinear resistance element 14b by forming only the dome-like pattern 21b made of polyimide having a light transmission characteristic at the periphery of the nonlinear resistance element 14b.

In the liquid crystal display shown in FIG. 23, no apertures are formed in a black matrix 17 formed on a second substrate 26.

As described above, the dome-like pattern 21b and the light reflection parts 21a are disposed at the periphery of the nonlinear resistance element 14b to guide light to the nonlinear resistance element 14b, thereby enabling even a liquid crystal display of a structure having difficulty with emitting light directly to the nonlinear resistance element 14b to emit light efficiently to the nonlinear resistance element 14b. Therefore, a characteristic change of the non-linear resistance element 14b can be made small.

Further, since the asymmetrical nonlinear resistance element characteristic change made according to the polarity of driving voltage can be made small, a display quality change made by driving the liquid crystal display or a flicker phenomenon and an image burn phenomenon caused by applying a DC voltage to the liquid crystal can be reduced.

Figure 24:
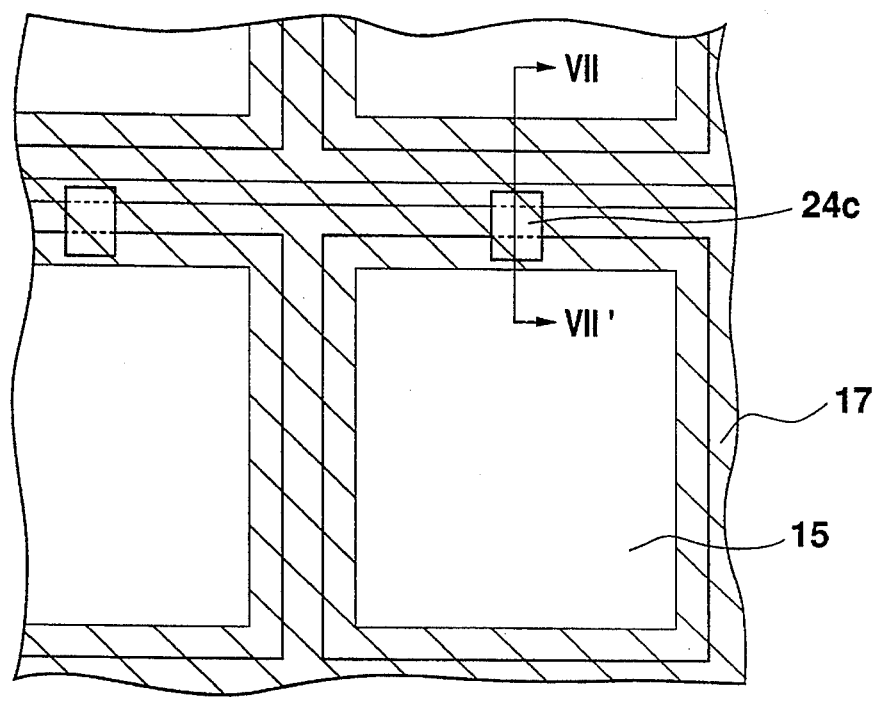
FIG. 24 is a plan view showing a liquid crystal display according to a tenth embodiment of the invention.
Figure 25:
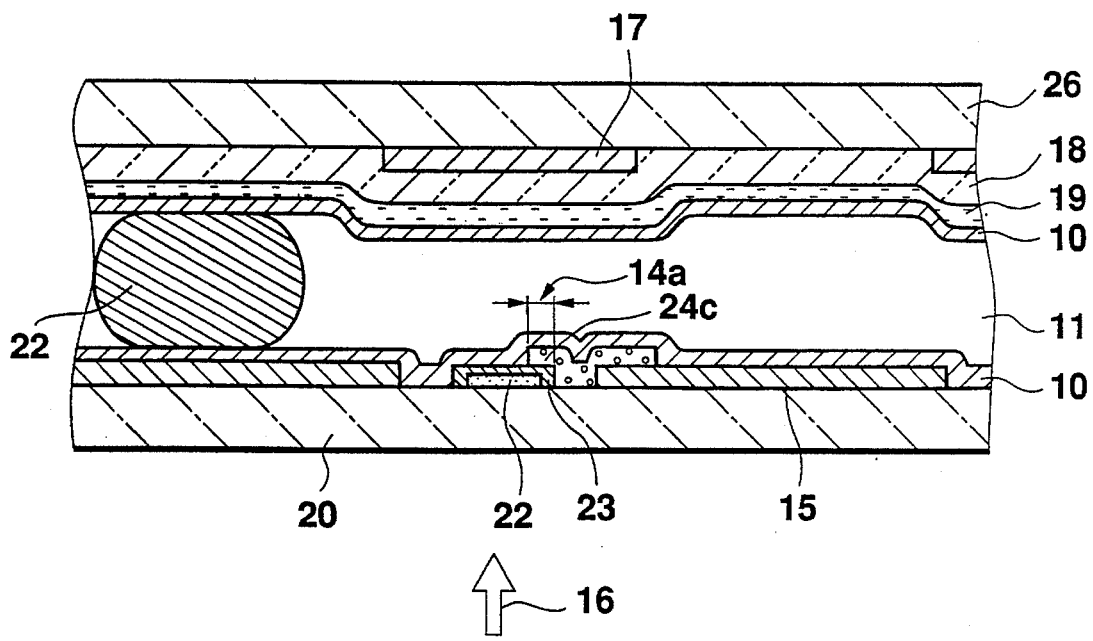
FIG. 25 is a sectional view taken on line VII–VII' of FIG. 24.

Tenth embodiment:

Next, a liquid crystal display according to a tenth embodiment of the invention will be described. FIG. 24 is a plan view showing the liquid crystal display according to the tenth embodiment of the invention. FIG. 25 is a sectional view taken on line VII–VII' of FIG. 24. The liquid crystal display according to the tenth embodiment of the invention is described in conjunction with FIGS. 24 and 25.

As shown in FIG. 25, in the embodiment, a thin film of tantalum having the film thickness of 60 nm is formed as a first electrode 22 on a first substrate 20.

Further formed on the first electrode 22 made of the thin film of tantalum is a nonlinear resistance layer 23 having the film thickness of 65 nm made of tantalum oxide formed by performing an anodic oxidation treatment of the first electrode 22. The thickness of the first electrode 22 is decreased by forming the tantalum oxide by the anodic oxidation treatment, so the film thickness of 60 nm of the first electrode 22 changes to 25 nm after the anodic oxidation treatment.

As a display electrode 15, a transparent conducting film of ITO, etc., is formed apart from the first electrode 22 at a given clearance that they do not overlap each other.

A chromium (Cr) film is used as a second electrode 24c. The second electrode 24c is formed in the side wall area of the first electrode 22 and a small area on the top of the first electrode 22 via the nonlinear resistance layer 23 made of the tantalum oxide, thereby forming a nonlinear resistance element 14a.

A black matrix 17 is formed on a second substrate 26 to prevent light from leaking from gaps in display electrodes 15 formed on the first substrate 20. In the tenth embodiment, no apertures are formed in the black matrix 17.

An opposite electrode 19 made of an ITO film is formed on the second substrate 26 so as to be opposite to the display electrode 15. The opposite electrode 19 is formed via an insulating film 18 so as not to be in contact with the black matrix 17.

In the embodiment shown in FIGS. 24 and 25, a display lighting section 15 is formed on the side of the first substrate 20 for efficiently emitting light to the nonlinear resistance element 14a. The first electrode 22 made of tantalum is made thin, thereby enabling light to be efficiently emitted to the nonlinear resistance element 14a even if a material which is low in transmittance is used for the second electrode 24c.

A film such as chromium (Cr), tantalum (Ta), or titanium (Ti) can be used as a second electrode 24c which is good in symmetry of the element characteristic (current-voltage characteristic) and can also suppress asymmetrical degradation compared with use of an ITO film as second electrode 24c if tantalum is used as the first electrode 22. If such metal is used as a second electrode 24c, a change in the display quality or a flicker phenomenon and an image burn phenomenon caused by applying a DC voltage to the liquid crystal can also be furthermore reduced by emitting light to the nonlinear resistance element 14a.

Although the first to tenth embodiments of the invention are described using the structure of tantalum-tantalum oxide-ITO as the MIM structure, the description also applies to nonlinear resistance elements where anodic oxide film of the first electrode, a silicon oxide film, silicon nitride film, silicon carbide film, or tantalum oxide film formed by a method such as vapor phase epitaxial growth, sputtering, or vacuum evaporation, or aluminum oxide is applied as a nonlinear resistance layer.

Although ITO films are used as transparent conducting films, the description also applies to nonlinear resistance elements having a thin metal film or a monolayer film or lamination film of conductive metal oxide films.

Further, one nonlinear resistance element is used for one picture element electrode, but a plurality of nonlinear resistance elements connected in series or in parallel can also be used.

As described above, according to the configuration of the liquid crystal display of the invention, an asymmetrical change caused by the polarity of a nonlinear resistance element is suppressed, DC voltage application to liquid crystal is reduced, degradation of the quality of liquid crystal is suppressed, thereby preventing the contrast from degrading and a flicker phenomenon and an image burn phenomenon, or a residual image phenomenon from occurring.

Thus, the display quality of the liquid crystal display can be improved. Particularly for the burn phenomenon, an improvement can be made to characteristics so that they are as good as those of the 3-terminal family.

What is claimed is:

1. A liquid crystal display comprising:

a first substrate and a second substrate between which liquid crystal is held;

a first electrode and a second electrode formed separately on said first substrate;

a nonlinear resistance element formed by disposing said first and second electrodes opposite to each other through an insulating film, at least one of the first and second electrodes contacting the insulating film at an interface; and light emission means being disposed on either side of said first and second substrates for emitting light to said interface, wherein light is emitted from the side of said second substrate by said light emission means, and a shielding layer is formed at a predetermined position on said second substrate, said shielding layer being provided with an aperture in an area opposite to said nonlinear resistance element on said first substrate.

2. The liquid crystal display as claimed in claim 1 wherein a quantity of light emitted from said light emission means to said nonlinear resistance element is 5000 lux or more.

3. The liquid crystal display as claimed in claim 1 wherein either a color filter or a combination of color filters is formed in said aperture.

4. The liquid crystal display as claimed in claim 1 wherein a blue color filter is formed in said aperture.

5. The liquid crystal display as claimed in claim 1 wherein shielding parts are located at a periphery of said nonlinear resistance element on said first substrate.

6. The liquid crystal display as claimed in claim 5 wherein said shielding parts located at the periphery of said nonlinear resistance element on said first substrate are made of the same material as said first or second electrode.

7. The liquid crystal display as claimed in claim 1 wherein said first electrode is made of tantalum and said second electrode, being opposite to said first electrode through tantalum oxide formed by anodic oxidation of said tantalum, is made of a transparent conducting film, an indium tin oxide film, a chromium film, or a lamination layer of chromium and a transparent conducting film.

8. A liquid crystal display comprising:
- a first substrate and a second substrate between which liquid crystal is held;
- a first electrode and a second electrode formed separately on said first substrate, said first electrode being conductively connected to a bus;
- a nonlinear resistance element formed by disposing said first and second electrodes opposite to each other, the first and second electrodes sandwiching an insulating film, at least one of the first and second electrodes contacting the insulating film at an interface; and
- light emission means being disposed on the side of said first substrate for emitting light to said nonlinear resistance element, wherein light is emitted to said interface from the side of said first electrode.

9. The liquid crystal display as claimed in claim 8 wherein said first electrode is made of tantalum and said second electrode, being opposite to said first electrode through tantalum oxide formed by anodic oxidation of said tantalum, is made of a transparent conducting film, an indium tin oxide film, a chromium film, or a lamination layer of chromium and a transparent conducting film.

10. The liquid crystal display as claimed in claim 8 wherein a quantity of light emitted from said light emission means to said nonlinear resistance element is 5000 lux or more.

11. The liquid crystal display as claimed in claim 8 wherein said first electrode has a film thickness through which light of 5000 lux or more can be passed.

12. The liquid crystal display as claimed in claim 11 wherein film thickness of said first electrode is 60 nm or less.

13. A liquid crystal display as comprising:
- a first substrate and a second substrate between which liquid crystal is held;
- a first electrode and a second electrode formed separately on said first substrate;
- a nonlinear resistance element formed by disposing said first and second electrodes opposite to each other through an insulating film, at least one of the first and second electrodes contacting the insulating film at an interface; and
- light emission means being disposed on the side of said first substrate for emitting light to said nonlinear resistance element, wherein light is emitted to said interface from the side of said first substrate, wherein light reflection parts for directing light onto said nonlinear resistance element are disposed at a periphery of said nonlinear resistance element on said first substrate.

14. The liquid crystal display as claimed in claim 13 wherein said light reflection parts are made of the same material as said first or second electrode.

15. A liquid crystal display comprising:
- a first substrate and a second substrate between which liquid crystal is held;
- a first electrode and a second electrode formed separately on said first substrate;
- a nonlinear resistance element formed by disposing said first and second electrodes opposite to each other through an insulating film, at least one of the first and second electrodes contacting the insulating film at an interface; and
- light emission means being disposed on the side of said first substrate for emitting light to said nonlinear resistance element, wherein light is emitted to said interface from the side of said first substrate, wherein a member substantially like a dome for focusing light on said nonlinear resistance element is disposed on said nonlinear resistance element and at its periphery.

16. The liquid crystal display as claimed in claim 13 wherein said dome-like member for focusing light on said nonlinear resistance element is made of polyimide.

17. A liquid crystal display comprising:
- a first substrate and a second substrate between which liquid crystal is held;
- a first electrode and a second electrode formed separately on said first substrate;
- a nonlinear resistance element formed by disposing said first and second electrodes opposite to each other through an insulating film, at least one of the first and second electrodes contacting the insulating film at an interface; and
- light emission means being disposed on the side of said first substrate for emitting light to said nonlinear resistance element, wherein light is emitted to said interface from the side of said first substrate, wherein light reflection parts and a dome-like member for focusing light on said nonlinear resistance element are disposed in the periphery of said nonlinear resistance element.

18. A liquid display comprising:
- a first substrate and a second substrate between which liquid crystal is held;
- a first electrode and a second electrode formed separately on said first substrate, said first electrode being conductively connected to a bus;
- a nonlinear resistance element formed by disposing said first and second electrodes opposite to each other, the first and second electrodes sandwiching an insulating film, each electrode forming an interface with the insulating film; and
- light emission means being disposed on the side of said first substrate for emitting light to said nonlinear resistance element, wherein light is emitted to at least one of the interfaces from the side of said first electrode.

\* \* \* \* \*